(12) United States Patent
Dehe

(10) Patent No.: US 9,148,726 B2
(45) Date of Patent: Sep. 29, 2015

(54) MICRO ELECTRICAL MECHANICAL SYSTEM WITH BENDING DEFLECTION OF BACKPLATE STRUCTURE

(75) Inventor: Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 565 days.

(21) Appl. No.: 13/230,264

(22) Filed: Sep. 12, 2011

(65) Prior Publication Data

US 2013/0062710 A1    Mar. 14, 2013

(51) Int. Cl.
| | |
|---|---|
| H04R 7/14 | (2006.01) |
| H04R 7/12 | (2006.01) |
| B81C 1/00 | (2006.01) |
| G01L 9/00 | (2006.01) |
| H04R 7/24 | (2006.01) |
| H04R 31/00 | (2006.01) |
| H04R 1/00 | (2006.01) |
| H04R 19/00 | (2006.01) |

(52) U.S. Cl.
CPC ............ *H04R 7/125* (2013.01); *B81C 1/00158* (2013.01); *B81C 1/00476* (2013.01); *G01L 9/0016* (2013.01); *H04R 7/24* (2013.01); *H04R 31/003* (2013.01); *B81B 2201/0257* (2013.01); *B81B 2203/0127* (2013.01); *B81C 2201/0167* (2013.01); *H04R 1/005* (2013.01); *H04R 7/14* (2013.01); *H04R 19/005* (2013.01); *H04R 2201/003* (2013.01); *H04R 2440/05* (2013.01)

(58) Field of Classification Search
CPC .......................... B81B 7/0058; B81C 1/00476
See application file for complete search history.

(56) References Cited

U.S. PATENT DOCUMENTS

| | | | |
|---|---|---|---|
| 5,146,435 A | 9/1992 | Bernstein | |
| 7,040,173 B2 | 5/2006 | Dehe | |
| 2006/0076648 A1 | 4/2006 | Gally et al. | |
| 2006/0077147 A1* | 4/2006 | Palmateer et al. | 345/85 |
| 2007/0201710 A1 | 8/2007 | Suzuki et al. | |
| 2008/0029832 A1* | 2/2008 | Forbes | 257/408 |
| 2008/0104825 A1 | 5/2008 | Dehe et al. | |
| 2008/0164544 A1* | 7/2008 | Palmateer et al. | 257/415 |
| 2011/0075865 A1* | 3/2011 | Yang et al. | 381/174 |
| 2013/0057558 A1* | 3/2013 | Pu et al. | 345/501 |

FOREIGN PATENT DOCUMENTS

| | | |
|---|---|---|
| CN | 101427591 | 5/2009 |
| DE | 102006055147 A1 | 5/2008 |

(Continued)

OTHER PUBLICATIONS

Torkkeli, A., et al., "Capacitive microphone with low-stress polysilicon membrane and high-stress polysilicon backplate," Sensors and Actuators A: Physical (2000), vol. 85, No. 1-3, pp. 116-123, Elsevier Science.

(Continued)

*Primary Examiner* — Daniel Luke
(74) *Attorney, Agent, or Firm* — Slater & Matsil, L.L.P.

(57) ABSTRACT

A micro electrical mechanical system includes a membrane structure and a backplate structure. The backplate structure includes a backplate material and at least one pre-tensioning element mechanically connected to the backplate material. The at least one pre-tensioning element causes a mechanical tension on the backplate material for a bending deflection of the backplate structure in a direction away from the membrane structure.

32 Claims, 20 Drawing Sheets

(56) References Cited

FOREIGN PATENT DOCUMENTS

| | | |
|---|---|---|
| GB | 2443756 A | 5/2008 |
| GB | 2 454 603 A | 5/2009 |
| GB | 2467776 A | 8/2010 |
| JP | 2007194913 | 8/2007 |

OTHER PUBLICATIONS

Mikolajūnas, M., et al., "An Impact of the Residual Stress on the Sacrificial Release of Microelectromechanical Membranes," Materials Science, ISSN 1392-1320, vol. 13, No. 1, 2007, 4 pages.

Mimoun, B., et al., "Mechanical study of silicon nitride layers on thin flexible substrates under bending," Proc. of 12th Workshop on Semiconductors Advances for Future Electronics and Sensors (SAFE 2009), pp. 95-98, Veldhoven, The Netherlands: STW (ISBN: 978-90-73461-62-8).

Mikolajūnas, M., "Formation and Investigation of Silicon Nitride Films for Membrane Applications," Summary of Doctoral Dissertation Technological Sciences, Materials Engineering (08T), Apr. 21, 2011, Kaunas University of Technology, Institute of Materials Science.

* cited by examiner

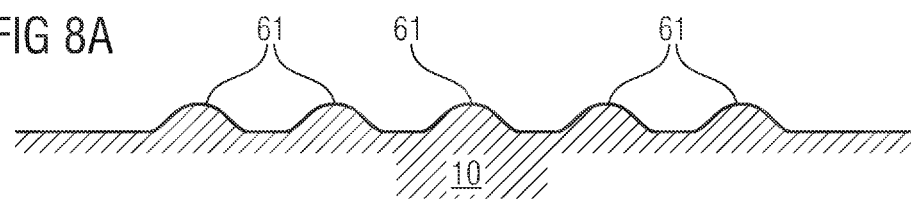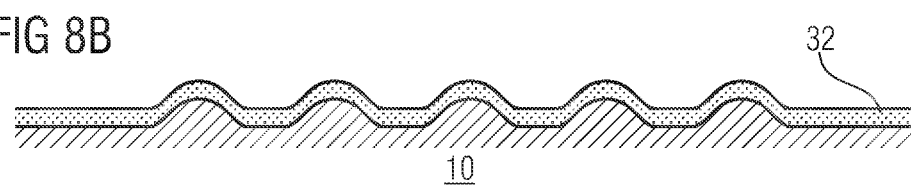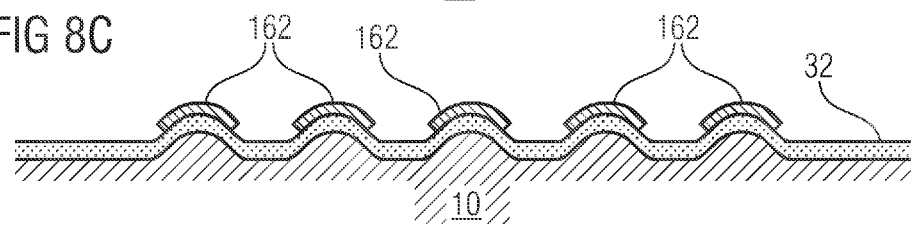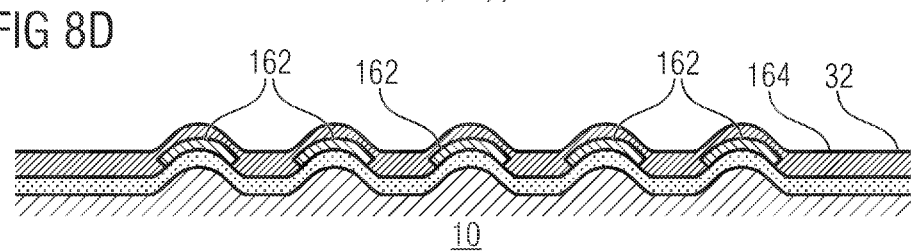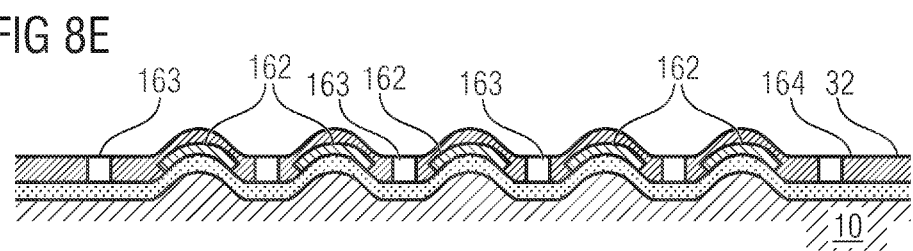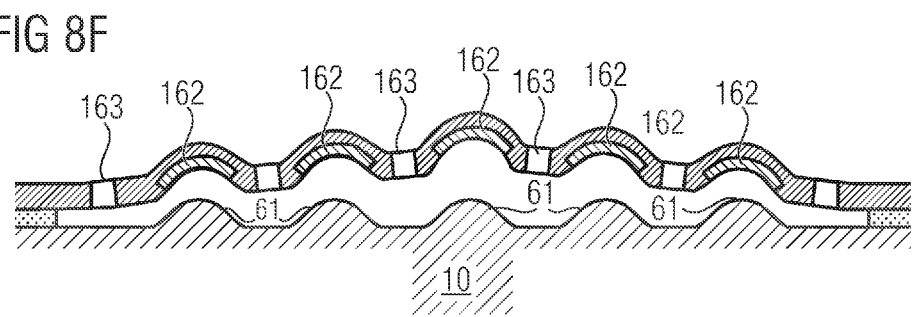

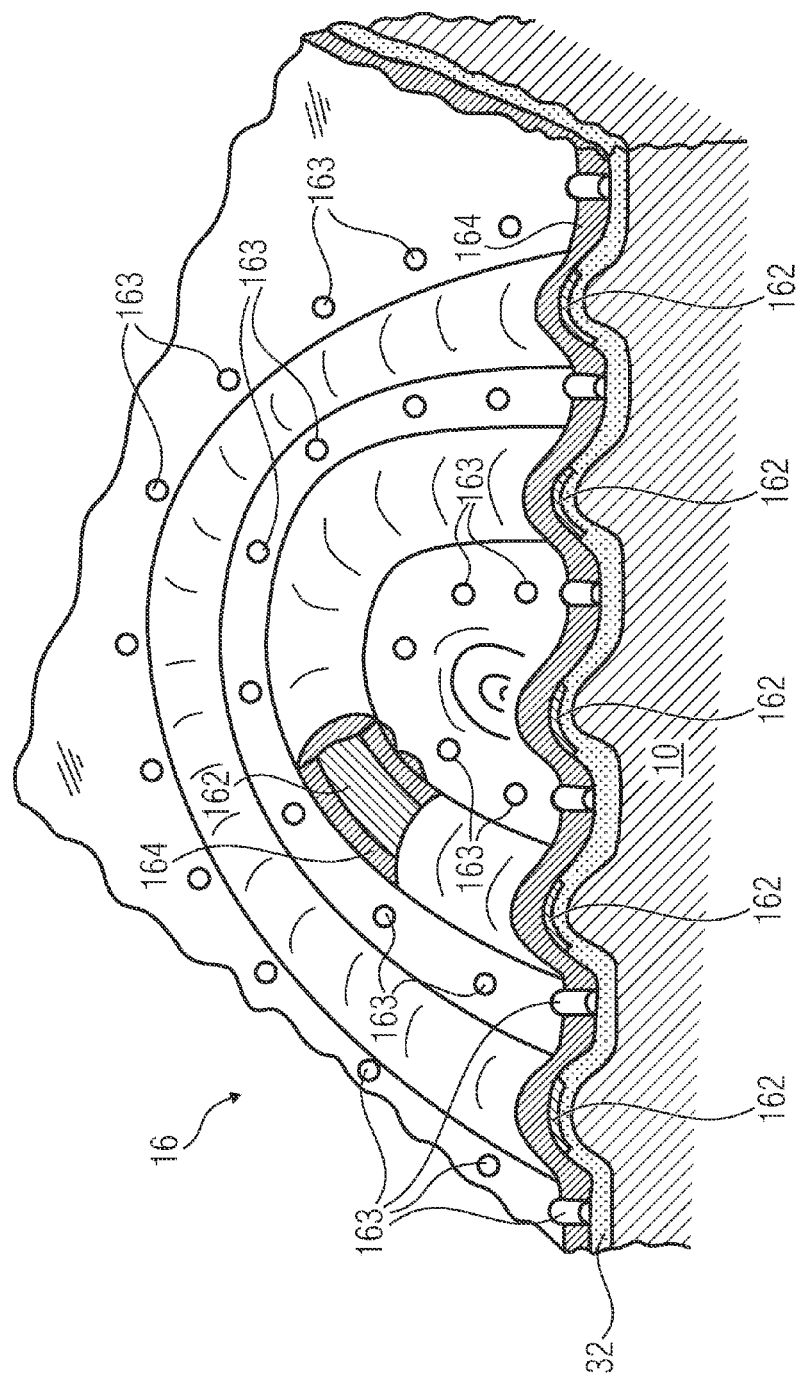

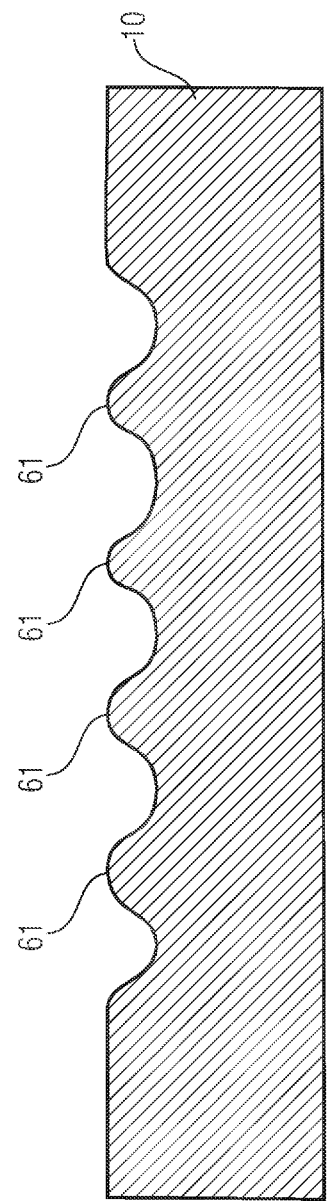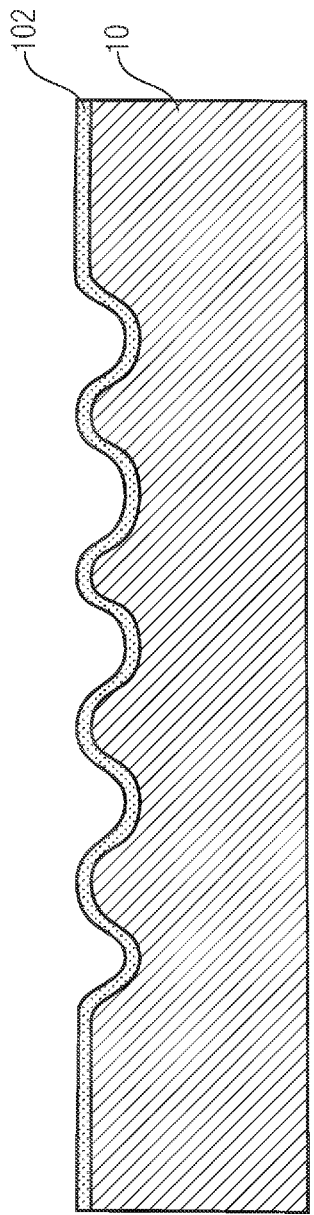

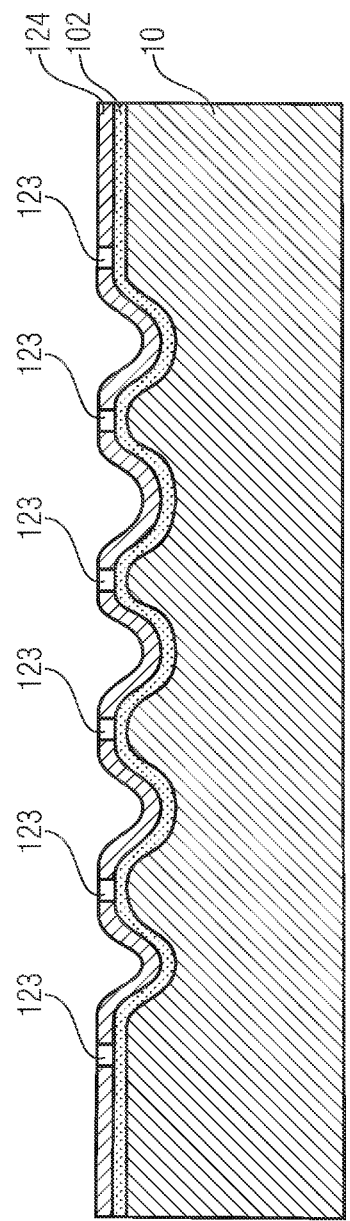
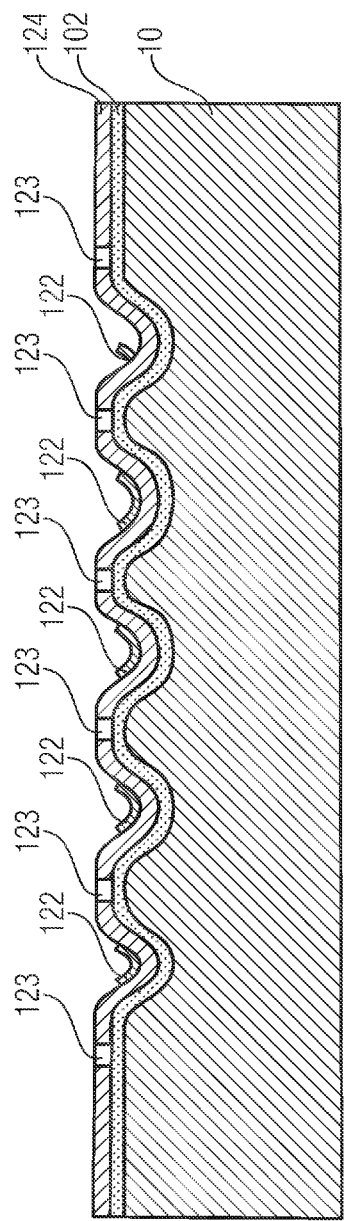
FIG 11C
FIG 11D

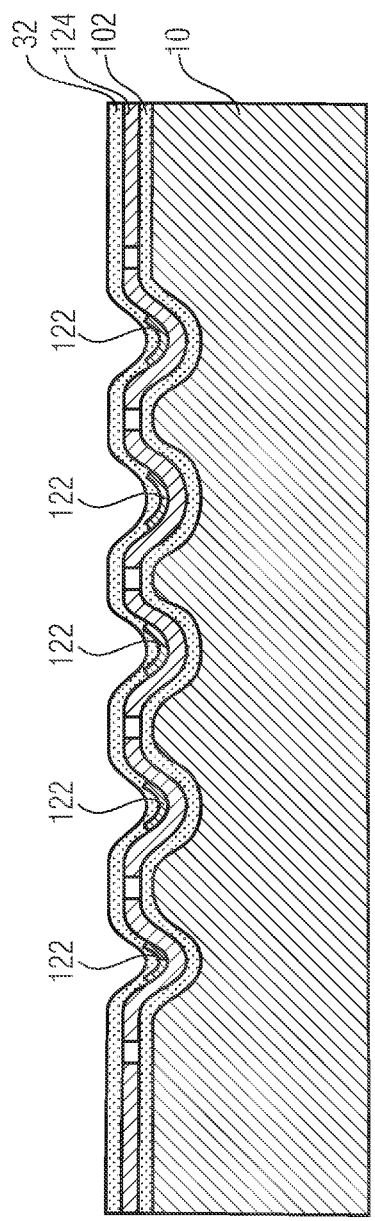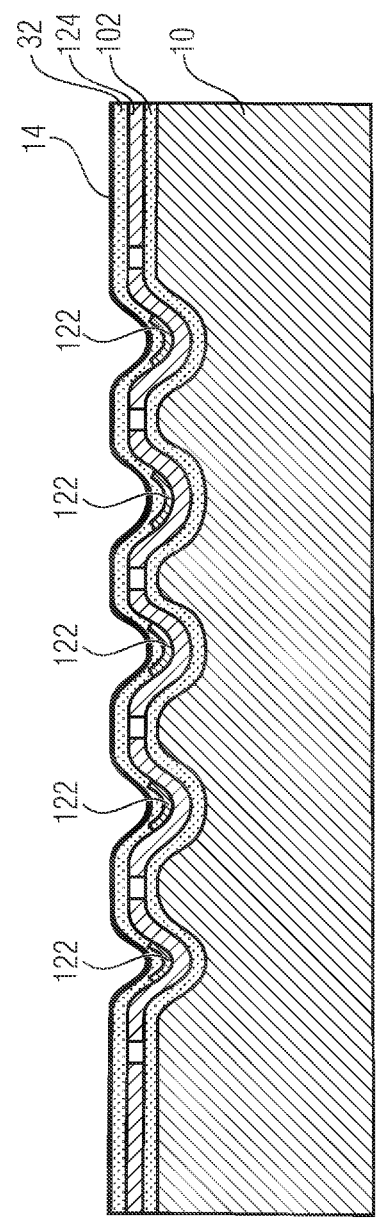

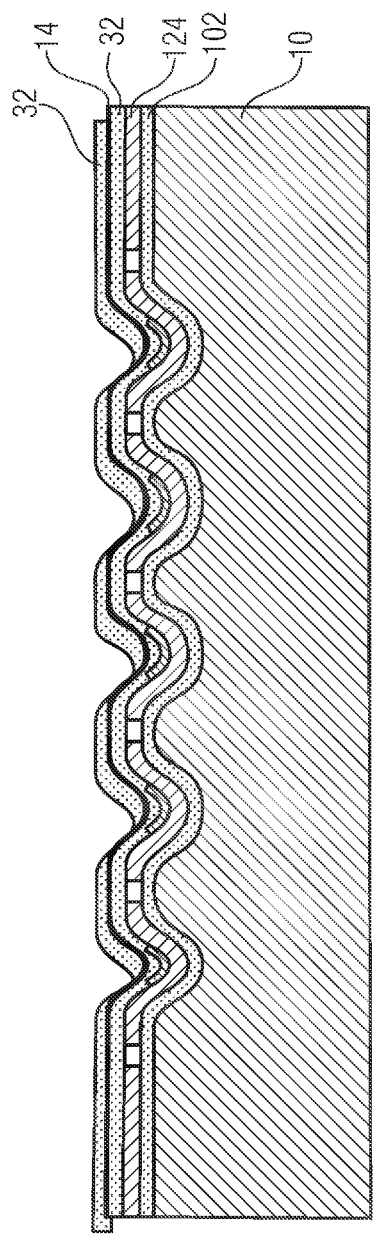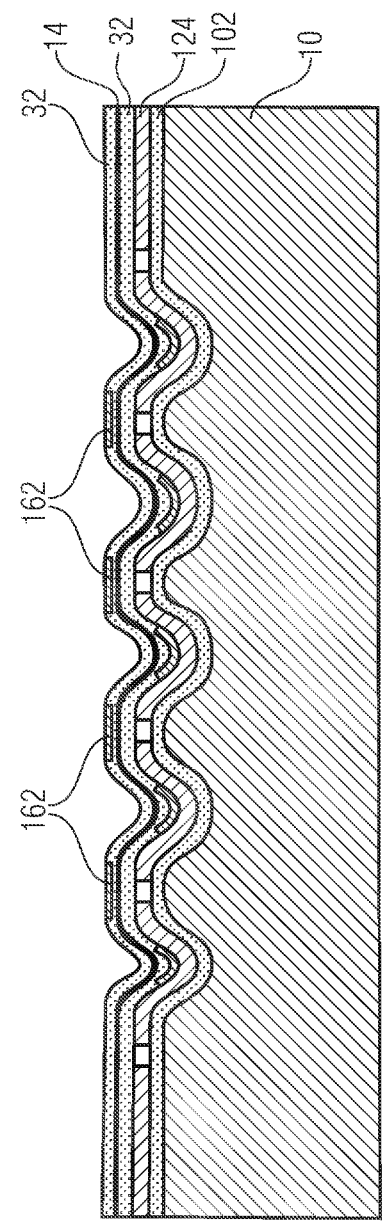

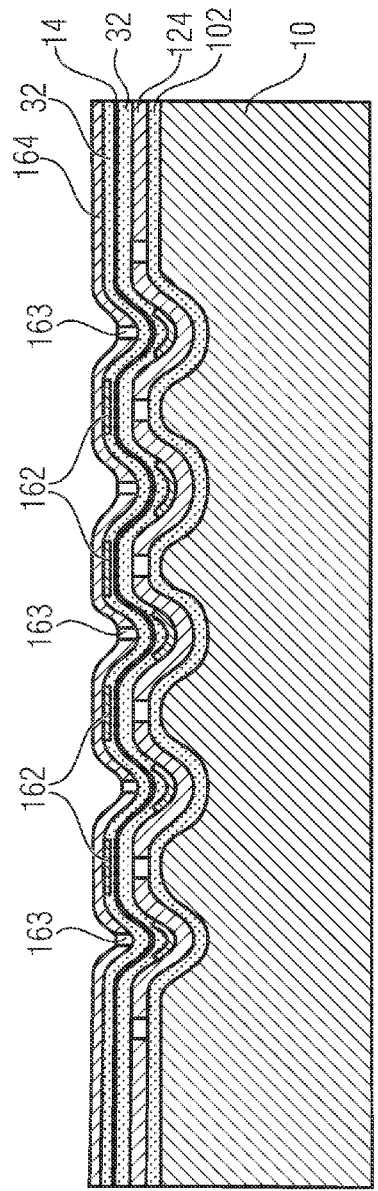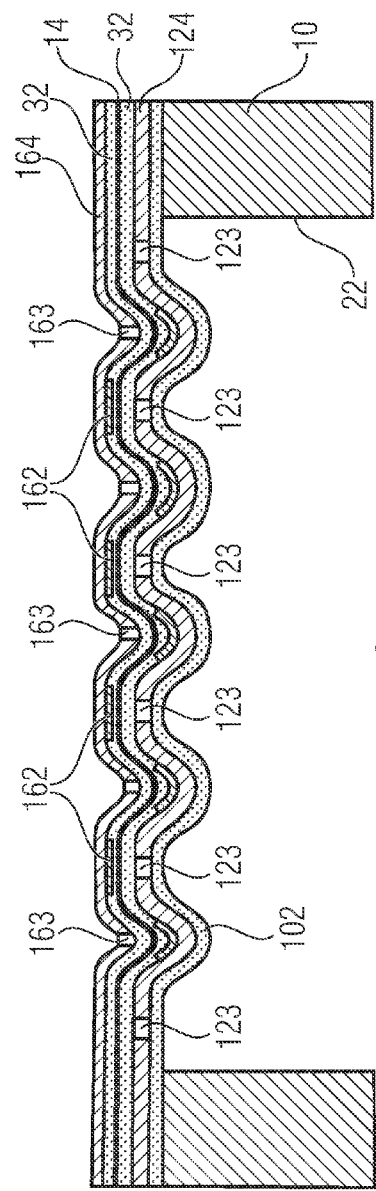

MICRO ELECTRICAL MECHANICAL SYSTEM WITH BENDING DEFLECTION OF BACKPLATE STRUCTURE

TECHNICAL FIELD

Embodiments of the present invention relate to micro electrical mechanical systems (MEMS) comprising a membrane structure and a backplate structure. Some embodiments of the present invention relate to a method for manufacturing a micro electrical mechanical system.

BACKGROUND

In the technical field of transducers miniaturization is one of the major research interests. At the same time, typical performance figures of the transducers, such as signal-to-noise ratio or dynamic range should be maintained at a reasonable level. Micro electrical mechanical systems (MEMS) have been targeted for these applications as they are potentially small scaled, on the order of tens of micrometers, and for their compatibility with semiconductor-like processes. This leads to potentially large volume manufacture. Devices that can be achieved using MEMS fabrication processes are, for example, pressure sensors, ultrasonic transducers, loudspeakers, and microphones. Typically these devises comprise one or more membranes with electrodes for read-out/drive deposited on the membranes and/or a substrate. In the case of electrostatic MEMS pressure sensors and microphones, the read-out is usually accomplished by measuring the capacitance between the electrodes. In the case of transducers functioning as actuators, such as loudspeakers, the device is driven by applying a potential difference across the electrodes.

Typically, the membrane of a MEMS transducer is manufactured using a sacrificial layer, for example, silicon oxide $SiO_2$. In use, the amplitude of the membrane movement is typically limited by approximately the thickness of the sacrificial layer because of structures formed on the sacrificial layers during the manufacturing process prior to (partly) removing the sacrificial layer, thus leaving the formed structures.

SUMMARY OF THE INVENTION

Embodiments of the present invention provide a micro electrical mechanical system comprising a membrane structure and a backplate structure. The backplate structure comprises a backplate material and at least one pre-tensioning element mechanically connected to the first backplate material. The at least one pre-tensioning element is configured to cause a mechanical tension on the backplate material for a bending deflection on the backplate structure in a direction away from the membrane structure.

Further embodiments of the present invention provide a micro electrical mechanical system comprising a support structure, a membrane structure, and a backplate structure. The membrane structure is mechanically connected to the support structure at a membrane structure connection location. The backplate structure is also mechanically connected to the support structure at a backplate structure connection location. The backplate structure connection location is spaced apart from the membrane structure connection location. The backplate structure comprises a backplate material and at least one pre-tensioning element mechanically connected to the backplate material. The at least one pre-tensioning element is configured to unfold the backplate structure, so that the distance between the backplate structure and the membrane structure varies over the backplate structure and the minimal distance is at the backplate structure connection location.

Embodiments of the present invention provide a method for manufacturing a micro electrical mechanical system. The method comprises forming a layer for a membrane structure, forming a sacrificial layer, depositing a layer of a backplate material, forming at least one pre-tensioning element, and etching the sacrificial layer. The sacrificial layer is formed on the layer for the membrane structure. The layer of the backplate material is deposited on a surface of the sacrificial layer. The at least one pre-tensioning element is formed on a surface of a backplate material. As an alternative the at least one pre-tensioning element is embedded in the backplate material. The layer of the backplate material and the at least one pre-tensioning element are released by etching the sacrificial layer. This causes the layer of the backplate material and the at least one pre-tensioning element to bend in a direction away from the membrane structure as a result of a mechanical tension exerted by the pre-tensioning element on the backplate material.

Further embodiments of the present invention provide a method for manufacturing a micro electrical mechanical system. The method comprises forming at least one pre-tensioning element on a surface of a base layer. A layer of a backplate material is deposited. A sacrificial layer and a layer defining a membrane structure are deposited. The sacrificial layer is then etched. The layer of the backplate material is deposited on the surface of the base layer and the at least one pre-tensioning element. The sacrificial layer is deposited on a surface of the layer of the backplate material. The layer defining the membrane structure is deposited on a surface of the sacrificial layer. By etching the sacrificial layer and at least a portion of the base layer, the layer of the backplate material and the at least one pre-tensioning element are released which causes the layer of the backplate material and the at least one pre-tensioning element to bend in a direction away from the membrane structure as a result of a mechanical tension exerted by the pre-tensioning element on the backplate material.

BRIEF DESCRIPTION OF THE DRAWINGS

Embodiments of the present invention are described herein, making reference to the appended drawings.

FIGS. 8A-8F, collectively FIG. 8, illustrate a number of intermediate states in a cross-sectional view of a detail of a micro electrical mechanical system during a manufacturing process according to an embodiment of the teachings disclosed herein;

FIG. 10 shows a perspective and partly cross-sectional view of a micro electrical mechanical system according to an embodiment of the teachings disclosed herein during an intermediate state of a manufacturing process according to the teachings disclosed herein;

FIGS. 11A to 11K illustrate, as cross-sectional views, a number of intermediate states of a manufacturing process according to the teachings disclosed herein;

Equal or equivalent elements or element with equal or equivalent functionality are denoted in the following description by equal reference numerals or similar reference numerals.

DETAILED DESCRIPTION OF ILLUSTRATIVE EMBODIMENTS

Figure 1:
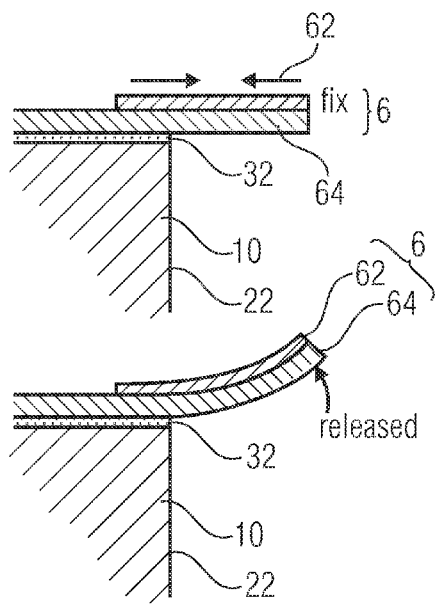
FIG. 1 shows a basic principle of a bending deflection that can be observed at a two-layer structure.

In the following description, a plurality of details are set forth to provide a more thorough explanation of embodiments of the present invention. However, it will be apparent to one skilled in the art, that embodiments of the present invention may be practiced without these specific details. In other instances, well-known structures and devices are shown in schematic cross-sectional views or top-views rather than in detail in order to avoid obscuring embodiments of the present invention. In addition, features of the different embodiments described hereinafter, may be combined with other features and with other embodiments, unless specifically noted otherwise.

The possible applications of the teachings disclosed herein are for sensors (e.g., microphones) and for actuators (e.g., micro speakers). In particular, the teachings disclosed herein may be applied in connection with a digital speaker operating in contact mode (the membrane mechanically contacting the backplate(s) and low pull-in voltage in push-pull mode). Therefore, a microphone or a loudspeaker may comprise a micro electrical mechanical system which in turn comprises the following elements a membrane structure and a backplate structure. The backplate structure comprises a backplate material and at least one pre-tensioning element mechanically connected to the backplate material. The at least one pre-tensioning element is configured to cause a mechanical tension on the backplate material for a bending deflection of the backplate structure in a direction away from the membrane structure. The backplate structure may serve as a stator of the microphone or the loudspeaker. The membrane structure may serve as a diaphragm of the microphone or the loudspeaker.

Transducers for transducing an acoustic signal to an electrical signal or vice versa may be implemented using a micro electrical mechanical system. A loudspeaker is a transducer that transduces an electrical signal to an acoustic signal. A microphone is a transducer that transduces an acoustic signal to an electrical signal.

In order to satisfactorily fulfill its purpose, a loudspeaker has to provide large volume displacement to generate a sufficient sound pressure level. As far as microphones are concerned, a microphone typically needs a large air gap between a membrane and a backplate in order to provide high dynamic range and/or high signal-to-noise ratio (SNR).

Loudspeakers typically generate volume flow by displacement of a fluid, such as air. The displacement is obtained, in a large number of loudspeaker types, by a parallel movement relative to the sound propagation direction. This is true for many types of dynamic, piezoelectric, ferroelectric or electrostatic loudspeakers in the macroscopic as well as in the microscopic implementation. Hence, large displacements are needed which is difficult on the microscopic level of implementation, especially.

Microphones with a wide travelling range of the membrane typically have a relatively large air gap generated by a relatively thick sacrificial layer (e.g., several micrometers of silicon oxide). The position of thick layers is adding cost and especially has limits due to mechanical stress (wafer bow) and risk of cracks due to stress. At the same time such structures still may suffer from non-linear sensing due to non-parallel movement of the membrane (balloon type) against the flat backplate. Instead, a piston type of parallel movement of the membrane relative to the backplate is typically desired.

The teachings disclosed herein reveal how a wide air gap may be generated with a relatively thin sacrificial layer. Such a configuration may be used in a wide range MEMS actuator or sensor, wherein the term "wide range" refers to the driving range. The driving range corresponds to the possible displacement of the membrane and/or to the dynamic range of the transducer. For the purpose of generating a wide air gap a composite backplate may be constructed in a bimorph layer configuration. A base layer (or main layer) is of low tensile stress and a bending layer with high tensile stress covers selected parts of the base layer, or is embedded in the base layer at selected locations. After a release etch has been performed, the composite backplate will bend in a direction which is governed by the location(s) where the bending layer is present, a relation of the tensile/compressive stresses in the base layer and the bending layer, and/or other parameters. By structuring the bending layer so that it is applied at (a) selected location(s) of the base layer it is possible to control the bending of the backplate in a relatively precise manner. Thus, the final shape of the backplate after the release etch and after a completion of the bending process can be predetermined. Depending on the design of the backplate the backplate can have a center backplate deflection or displacement of several micrometers which is much more than a typical sacrificial layer thickness. For example, a backplate with 1 mm diameter and 15 concentric corrugations of 600 nm height has a central bending of 20 µm when a 330 nm thick base layer of polysilicon having 43 MPa tensile stress and a 280 nm thick bending layer of silicon nitride having 1 GPa tensile stress are used within a backplate structure. The ratio between the central bending of the backplate and the thickness of the sacrificial layer may be as large as 5, 10, 15, 20, 25, or even 30.

According to the teachings disclosed herein, a bimorph structure (two-layer structure) or a multi-layer structure is used to generate a buckling backplate structure that allows exceptionally high driving range for an actuator or sensor element. The two-layer structure may be arranged on a curved surface or form a curved surface itself. A possible application of the teachings disclosed herein is within wide rage MEMS actuators or sensors.

FIG. 1 illustrates a basic concept of obtaining a bending deflection of a two-layer structure 6. The two-layer structure 6 is arranged on a surface of a remaining part of a sacrificial layer 32 which is in turn arranged on a surface of a substrate 10. Accordingly, the two-layer structure 6 is mechanically connected to the substrate 10 in an indirect manner via the sacrificial layer 32. A cavity 22 is formed in the substrate 10 and also the sacrificial layer 32 so that the two-layer structure 6 comprises a suspended portion. The two-layer structure 6 shown in FIG. 1 forms a cantilever arrangement with its left end being substantially clamped to the sacrificial layer 32. The upper picture in FIG. 1 shows the two-layered structure 6 when its right end is fixed with respect to the substrate 10 so that the two-layered structure 6 has a substantially straight or plane shape. The two-layered structure 6 comprises a first layer 64 and a second layer 62. The first layer 64 comprises a first material and the second layer 62 comprises a second material. The first material and the second material exhibit different tensile stresses so that the second layer 62 tends to reduce its spacial extension, i.e., it tends to shrink in order to reach a lower energy level. The first layer 64 on the other hand exhibits a lower tensile stress than the second layer 62. As the second layer 62 is arranged on an upper surface of the first layer 64, the second layer 62 exerts a force on the upper surface of the first layer 64 which is indicated by the two opposing arrows in the upper picture of FIG. 1. In alternative configurations, the two layers could exhibit different compressive stresses, or one layer could exhibit tensile stress and the other layer compressive stress. These alternative configurations could then lead to a bending of the bimorph structure in the opposite direction and/or with different amounts of bending.

The lower picture of FIG. 1 illustrates a situation in which the right end of the two-layered structure 6 has been released. Due to the force exerted by the second layer 62 on the upper surface of the first layer 64 the two-layered structure 6 is bend so that the upper surface of the first layer 64 (i.e., the interface between the first layer 64 and the second layer 62) can reduce its length. A final bending state of the two-layered structure 6 is obtained, when the various forces acting within the two-layered structure 6 are in equilibrium. For example, a lower surface of the first layer 64 is lengthened with respect to the state shown in the upper picture of FIG. 1. This creates an opposing force to the contracting force acting within the second layer 62.

The teachings disclosed herein exploit the fact that bimorphic structures tend to bend. Multiple structures can be applied to create a buckling backplate. According to some embodiments of the teachings disclosed herein large center deflections of the backplate are possible even though only a thin sacrificial layer or several thin sacrificial layers have been used.

Figure 2:
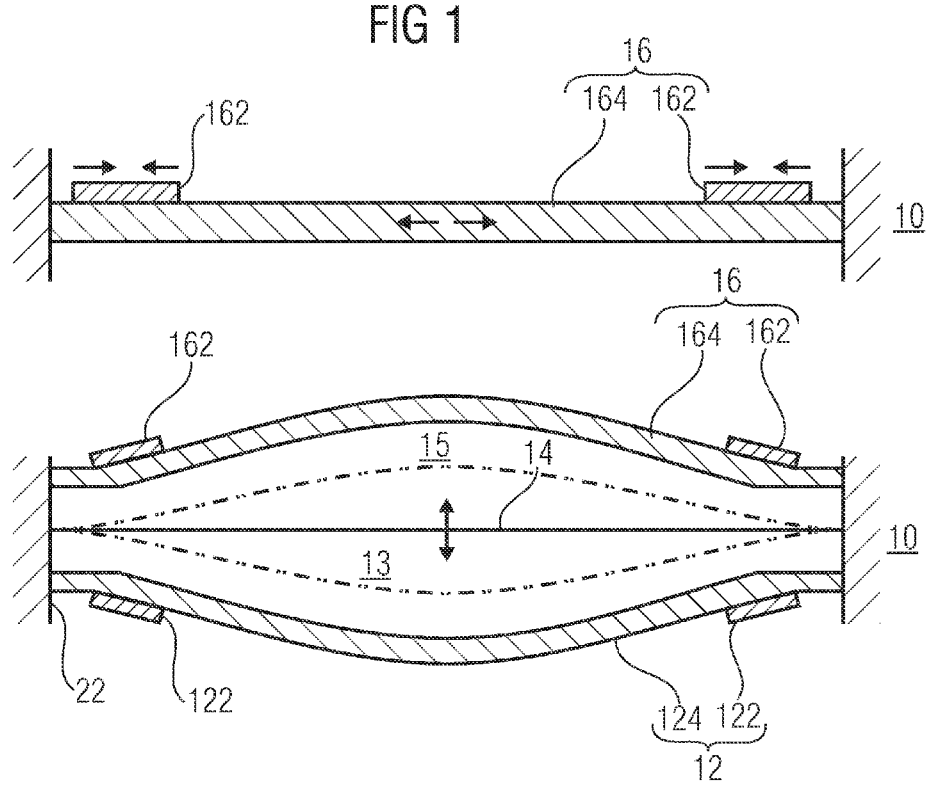
FIG. 2 illustrates an interaction between a layer exhibiting compressive stress and two pieces of a material exhibiting tensile stress.

FIG. 2 shows in an upper picture a cross-section of a backplate structure 16 according to some embodiments of the teachings disclosed herein. The backplate structure 16 comprises a backplate material 164 and two pre-tensioning elements 162 mechanically connected to the backplate material 164. The pre-tensioning elements 162 are made of, or comprise, a material that has a higher tensile stress than the backplate material 164. In the configuration shown in the upper picture of FIG. 2 the backplate material 164 has a substantially plane shape, i.e., the backplate material 164 may be regarded as a layer of backplate material. The backplate material 164 is fixed or mechanically connected at its left end and its right end to the substrate 10. In the area of the cavity 22 within the substrate 10 the backplate structure 16 comprises a suspended portion which is supported by the left end and the right end of the backplate structure 16 where it is mechanically connected to the substrate 10. A first one of the pre-tensioning elements 162 is arranged on an upper surface of the backplate material 164 between the left end of the backplate structure 16 and a center of the backplate structure 16. The first pre-tensioning element 162 does not extend all the way to the substrate 10 in a lateral direction, but a small interstice is provided between the substrate 10 and the first pre-tensioning element 162. The first pre-tensioning element 162 does not extend all the way to the center of the backplate structure 16 laterally to the right of the first pre-tensioning element 162. Rather, a relatively large distance separates the first pre-tensioning element 162 from the center of the backplate structure 16. The second pre-tensioning element 162 is arranged in a substantially symmetrical manner with respect to the first pre-tensioning element. Hence, the second pre-tensioning element 162 is close to the right end of the backplate structure 16. Note that the two pre-tensioning elements 162 shown in the upper picture of FIG. 2 could indeed be two different portions of a single pre-tensioning element 162 having a closed shape such as a ring, a square, a rectangle, an ellipse or an open shape, such as U-shaped.

By providing the pre-tensioning element(s) 162 at (a) selected location(s) on the surface of the backplate material 164 or embedded therein, it is possible to control the way in which the backplate structure 16 will bend, thus leading to a desired bending deflection of the backplate structure 16. In the configuration shown in the upper picture of FIG. 2, the pre-tensioning elements 162 cause a contraction of the interfaces between the backplate material 164 and the pre-tensioning elements 162 so that in the regions where the pre-tensioning elements 162 are provided the backplate material 164 bends upwards, thus raising a central portion of the backplate structure 16 in a direction that is substantially orthogonal to the plane in which the backplate structure 16 extends. The arrows drawn in the upper picture of FIG. 2 represent the different stresses that can be observed in the pre-tensioning elements 162 and the backplate material 164, respectively. The pre-tensioning elements 162 are subjected to relatively high tensile stress as can be seen by the two arrows pointing at each other. In contrast, the backplate material 164 is subjected to a compressive stress, as indicated by the two arrows pointing away from each other. Note that it is not necessary that one of the materials used for the pre-tensioning elements 162 and the layer of backplate material 164 is subjected to a compressive stress while the other is subjected to a tensile stress, i.e., that the stresses in the two materials are of opposite sign or type. Rather, both materials may be subjected to either a tensile stress or a compressive stress, provided that the magnitudes of the stresses are different. In configurations in which the pre-tensioning element(s) is/are subjected to a compressive stress, the pre-tensioning element(s) are typically arranged on an opposite surface of the backplate material 164 than pre-tensioning elements subjected to tensile stress in order to obtain the same direction of deflection.

The lower picture in FIG. 2 shows a schematic cross-section of a micro electrical mechanical system comprising an upper backplate structure 16, a lower backplate structure 12, and a membrane structure 14 arranged between the upper and lower backplate structures 16, 12. The lower picture in FIG. 2 shows the backplate structures 12, 16 in a deflected state which is obtained after the backplate structures 16, 12 have been released from the sacrificial layer(s) (not shown in FIG. 2) by means of etching the sacrificial layer(s). The lower backplate structure 12 comprises a backplate material 124 and pre-tensioning elements 122. As the pre-tensioning elements 122 are arranged at a lower surface of the backplate material 124, the lower backplate structure 12 bends downwards. In a central portion thereof a first air gap 13 is thus formed between the lower backplate structure 12 and the membrane 14. A second air gap 15 is formed between the membrane 14 and the upper backplate structure 16. Both air gaps 13, 15 have a vault-like or arched shape as they are delimited at one of their surfaces by the lower backplate structure 12 or the upper backplate structure 16, respectively. The membrane 14 can oscillate with a relatively large amplitude as illustrated by the dash-dot-dot lines.

The micro electrical mechanical system shown in the lower picture of FIG. 2 could have a rotational symmetry about a center axis located half way between the left end and the right end of the backplate structures 12, 16 and extending substantially orthogonal to the plane of the membrane 14. Accordingly, the lower backplate structure 12, the upper backplate structure 16 and the membrane 14 would have a circular shape in a top-view or a bottom-view of the micro electrical mechanical system. Other shapes are also imaginable, such as rectangular, square, elliptical, hexagonal, octagonal, etc.

Figure 3:
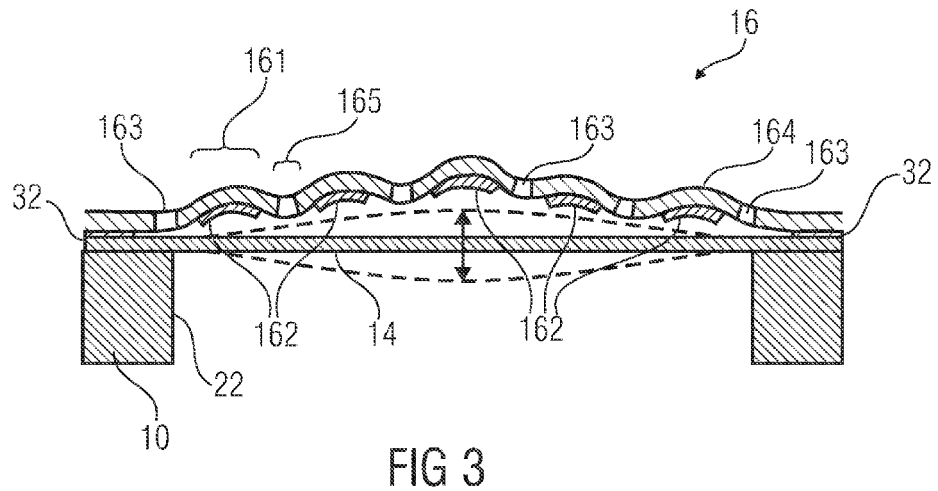
FIG. 3 shows a cross-section through a micro electrical mechanical system according to a first embodiment of the teaching disclosed herein.

FIG. 3 shows a schematic cross-section of the micro electrical mechanical system according to an embodiment of the teachings disclosed herein. In particular, FIG. 3 illustrates how the teachings disclosed herein can be applied to single backplate structures. The micro electrical mechanical system comprises a membrane structure 14 and the backplate structure 16. The backplate structure 16 comprises a backplate material 164 and at least one pre-tensioning element 162 mechanically connected to the backplate material 164. In the embodiment illustrated in FIG. 3 the backplate structure 16 comprises five pre-tensioning elements 162. As explained in connection with FIG. 2, some of the shown pre-tensioning elements 162 could indeed be connected to each other, for example, in an annual manner. The pre-tensioning elements 162 cause a mechanical tension on the backplate material 164 for a bending deflection of the backplate structure 16 in direction away from the membrane structure 14. The mechanical tension on the backplate material 164 caused by the pre-tensioning elements 162 is spatially distributed to various locations of the backplate material 164. The backplate material 164 comprises a plurality of convex structures 161 and a plurality of concave structures 165. The convex structures 161 alternate with the concave structures 165. In a circular configuration of the backplate structure 16 the convex structures 161 and the concave structures 165 may be annular ridges and annular groves, respectively. The pre-tensioning elements 162 are arranged at a lower surface of the backplate material 164 beneath the locally convex structures 161. The contracting action of the pre-tensioning elements 162 causes the lower, concave surface of the locally convex structures 161 to straighten out to a certain degree. Studying the left most locally convex structure 161 in more detail it can be seen that the locally convex structure 161 is relatively rigidly connected to the substrate 10 at the left side of the locally convex structure 161. As the pre-tensioning element 162 arranged beneath the locally convex structure 161 causes the same to straighten out to some degree, a right hand portion of the locally convex structure is raised, i.e., deflected away from the membrane structure 14. This principle repeats itself for the other locally convex structure 161 so that the backplate structure 16 is significantly deflected at its center. This relatively large center deflection is due to a combination of the effect caused by the individual pre-tensioning elements 162 arranged in a spatially distributed manner on the lower surface of the backplate material 164. The pre-tensioning elements are configured to unfold the backplate structure from a fixed state to a released state. In the released state (or developed state) a distance between the membrane structure and the backplate structure varies as a function of the location, i.e., the membrane structure and the backplate structure are not parallel to each other. A minimum distance between the membrane structure and the backplate structure typically is between where the membrane structure is connected to a support structure (i.e., a "membrane structure connection location") and where the backplate structure is connected to the support structure (i.e., a "backplate structure connection location"). Before the backplate structure is unfolded to the unfolded state, the backplate structure is in a fixed state. The fixed state is maintained by some fixation mechanism, typically an adhesion of the backplate structure at a sacrificial material before the sacrificial material is removed by, e.g., etching.

The backplate structure 16 also comprises a plurality of holes 163 which are, in the configuration shown in FIG. 3, located at the locally concave structures 165. The holes 163 may have a double function. During a manufacturing process of the micro electrical mechanical system the holes 163 allow an etching agent to reach the sacrificial layer which is located between the membrane structure 14 and the backplate structure 16 at this stage of the manufacturing process. During the operation of the micro electrical mechanical system the holes 163 allow an acoustic wave to enter the air gap between the membrane structure 14 and the backplate structure 16, or to emerge from there.

A buckling backplate according to the teachings disclosed herein may be part of various applications for sensors/actuators that need wide driving range. For example, a single backplate structure as shown in FIG. 3 may be used for microphones with high linearity requirements at larger displacements resulting from high sound pressure levels (SPL). With respect to micro speakers a single backplate configuration as shown in FIG. 3 may be used for high actuation, especially in a digital driving mode.

Figure 4:
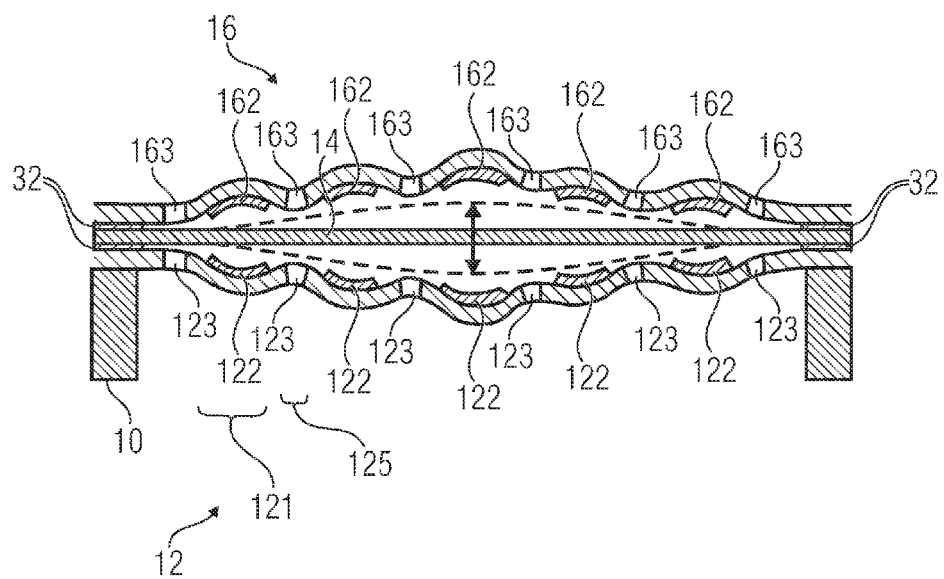
FIG. 4 shows a cross-section through a micro electrical mechanical system according to a second embodiment of the teaching disclosed herein.

FIG. 4 illustrates how the teachings disclosed herein can be applied to double backplate structures. FIG. 4 shows a micro electrical mechanical system according to another embodiment of the teachings disclosed herein. The membrane structure 14 and the upper backplate structure 16 are configured in substantially the same manner as the corresponding elements of the micro electrical mechanical system shown in FIG. 3. In addition, a lower backplate structure 12 is provided which is supported, at least in part, by the substrate 10. The membrane structure 14 is in turn supported, at least in part, by the lower backplate structure 12. The upper backplate structure 16 is supported, at least in part, by the membrane structure 14. A cavity 22 is formed in the substrate 10. The upper backplate structure 16, the membrane structure 14, and the lower backplate structure 12 are all supported by the substrate 10 in a region radially outside of the cavity 22. At the region outside the cavity 22 it can be seen that the membrane structure 14 was once embedded between two sacrificial layers 32 which have been etched away in a region substantially prolonging the cavity 22 between an upper surface of the lower backplate material 124 and a lower surface of the upper backplate material 164.

The lower backplate structure 12 comprises locally convex structures 121 and locally concave structures 125. Their effect and function is substantially the same as the locally convex structures 161 and the locally concave structures 165 of the upper backplate structure 16. The lower backplate structure 12 and the upper backplate structure 16 are substantially mirrored to each other about the plane of the membrane structure 14.

With respect to an application of the configuration shown in FIG. 4, double backplate microphones may be used for force feedback or differential read-out. In connection with microspeakers a double backplate may be used for analog push-pull operation or digital operation with even higher pull-in actuation.

Figure 5:
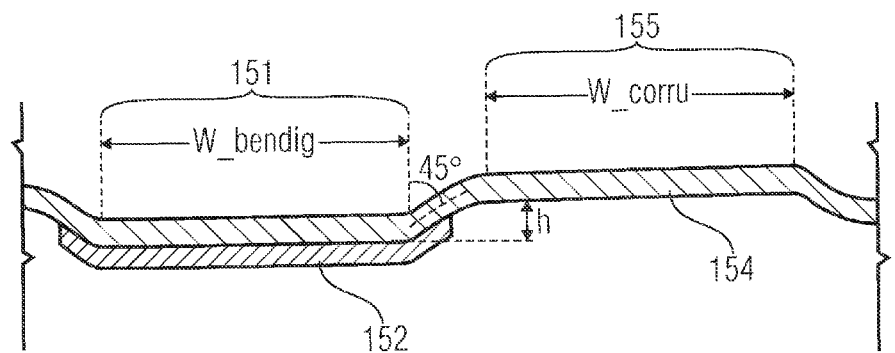
FIG. 5 shows a cross-section through a constructional detail of a backplate structure which has been used for computationally simulating a deflection of the backplate structure.

FIG. 5 shows the cross-section of a part of a simulated backplate structure 12 or 16. The part shown in FIG. 5 is a combination of a bending portion 151 and a corrugation 155. A pre-tensioning element 152 is arranged at a lower surface of the bending portion 151. The bending portion 151 has a width of Wbending and the corrugation 155 has a width of Wcorru. Within the bending portion 151 the backplate material 154 is offset in a direction orthogonal to the plane of the backplate material 154 by a distance h. A transition portion between the bending portion 151 the corrugation 155 is substantially at an angle of 45° with respect to the plane of the backplate material 154.

Figure 6:
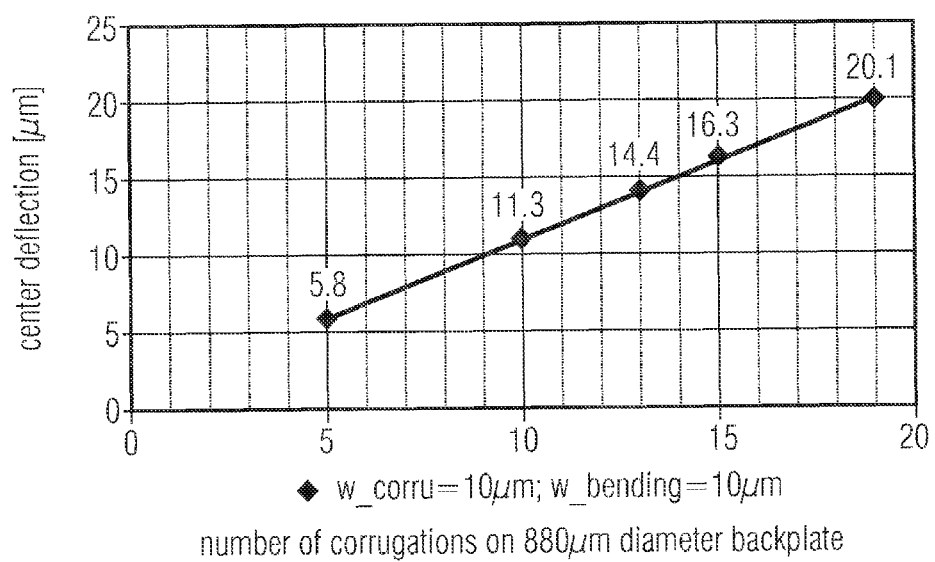
FIG. 6 illustrates a result of the simulation using the constructional detail of FIG. 5, in particular a central deflection of a backplate structure as a function of a number of corrugations.

FIG. 6 shows a result of a simulation of a backplate structure. The ordinate of the graph shown in FIG. 6 represents a center deflection in μm of the simulated backplate. The abscissa of the graph represents a number of corrugations within the backplate structure. The following values have been used for the purpose of the simulation: Wcorru=10 μm; Wbending=10 μm; H=600 nm; diameterbackplate=880 μm. It can be seen that even with a relatively low number of five corrugations a center deflection of almost 6 μm can be obtained which is already a multiple of the thicknesses of typical sacrificial layers. The center deflection increases to over 20 μm for 19 corrugations on the 880 μm diameter backplate.

The backplate material 154 is (or comprises) substantially polycrystalline silicon (PolySi) with a thickness of 330 nm and 100 MPa stress. The pre-tensioning element 152 comprises mostly silicon nitride (SiN), has a thickness of 280 nm and a stress of 1 GPa.

Figure 7:
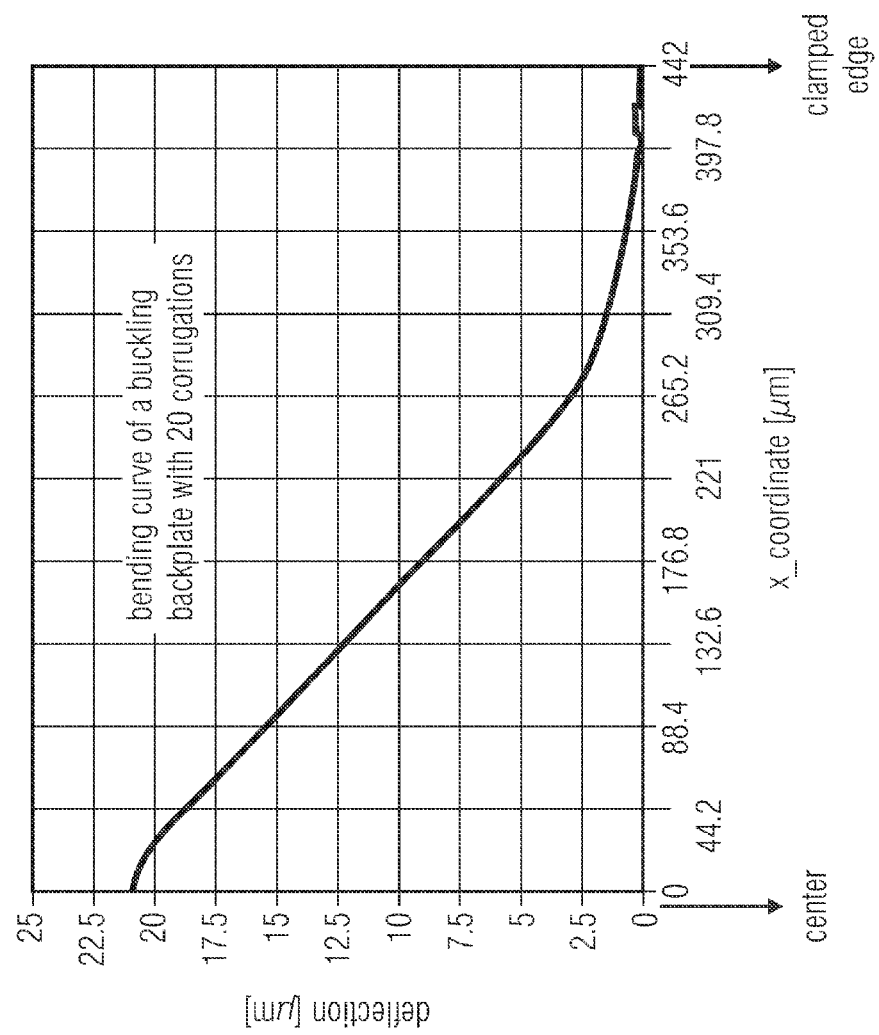
FIG. 7 illustrates another simulation result using the constructional detail shown in FIG. 5, in particular a deflection of the backplate structure as a function of the location on the backplate structure.

FIG. 7 illustrates another result of the simulation performed on a backplate comprising the constructional detail shown in FIG. 5. The ordinate of the graph represents the deflection in μm and the abscissa of the graph represents the x-coordinate, wherein x=0 μm corresponds to the center of the backplate structure and x=442 μm corresponds to a clamped edge of the backplate structure. The graph in FIG. 7 shows the bending curve of a buckling backplate with 20 corrugations. It can be seen that the bending curve comprises a substantially linear section between two curved transitions. Applied to a circular backplate this means that the backplate structure has a substantially conical or frustoconical shape.

FIG. 8 shows in FIGS. 8A to 8F a process flow to generate a "buckling backplate". FIG. 8A shows a substrate 10 which may be, for example, made of silicon (Si). The substrate 10 is defined with a circular well structure which may have been obtained from a LOCOS (Local Oxidation Of Silicon) process, for example. The LOCOS process creates the number of locally convex structures 61 on the substrate 10.

In FIG. 8B a sacrificial layer 32 has been deposited on the substrate 10 and also on the locally convex structures 61. The sacrificial layer may be, for example, tetraethyl orthosilicate (TEOS), wet oxide, carbon or another suitable material.

During a subsequent step, a result of which is illustrated in FIG. 8C a bending layer with high tensile stress has been deposited and structured against the sacrificial layer 32 such that only the locally convex surfaces of the sacrificial layer 32 reproducing the locally convex structures 61 of the substrate 10 are covered. This leads to the formation of the pre-tensioning element 162. The bending layer may be silicon nitride (SiN).

FIG. 8D illustrates a state of the process flow at which a backplate layer 164 with low stress has been deposited on the sacrificial layer 32 and also the pre-tensioning elements 162. The backplate layer 164 may be a polycrystalline silicon. The locally convex structure 61 of the substrate 10 are also reproduced by the sacrificial layer 32 and the backplate layer 164.

In FIGS. 8C and 8D of FIG. 8 the pre-tensioning elements 162 are shown as being in contact with the sacrificial layer 32. As an alternative, the pre-tensioning elements 162 may be (fully) embedded in the backplate material 164. During an optional step preceding the deposition of the bending layer as illustrated in FIG. 8D, a first partial layer of backplate material 164 may be deposited on the first sacrificial layer 32. After the formation of the pre-tensioning elements 162 a second partial layer of backplate material 164 is deposited on the sacrificial layer 32 and the pre-tensioning elements 162. In this manner, the pre-tensioning elements 162 are (fully) embedded in the backplate material or layer 164. Typically, the first partial layer of the backplate material 164 will be chosen thinner than the second partial layer of the backplate material 164 so that the pre-tensioning elements 162 are closer to a lower surface of the backplate material 164 than to an upper surface of the backplate material 164.

Etch release holes 163 are then structured into the backplate layer 164 as can be seen in FIG. 8E.

FIG. 8F shows the result of performing the release of the inner part of the backplate layer 164. The large tensile stress of the pre-tensioning elements 162 (resulting from the bending layer) is released and causes the backplate structure to bend. Significantly larger deflections of the backplate may be generated, especially when compared to the thickness of the sacrificial layer 32.

Figure 9:
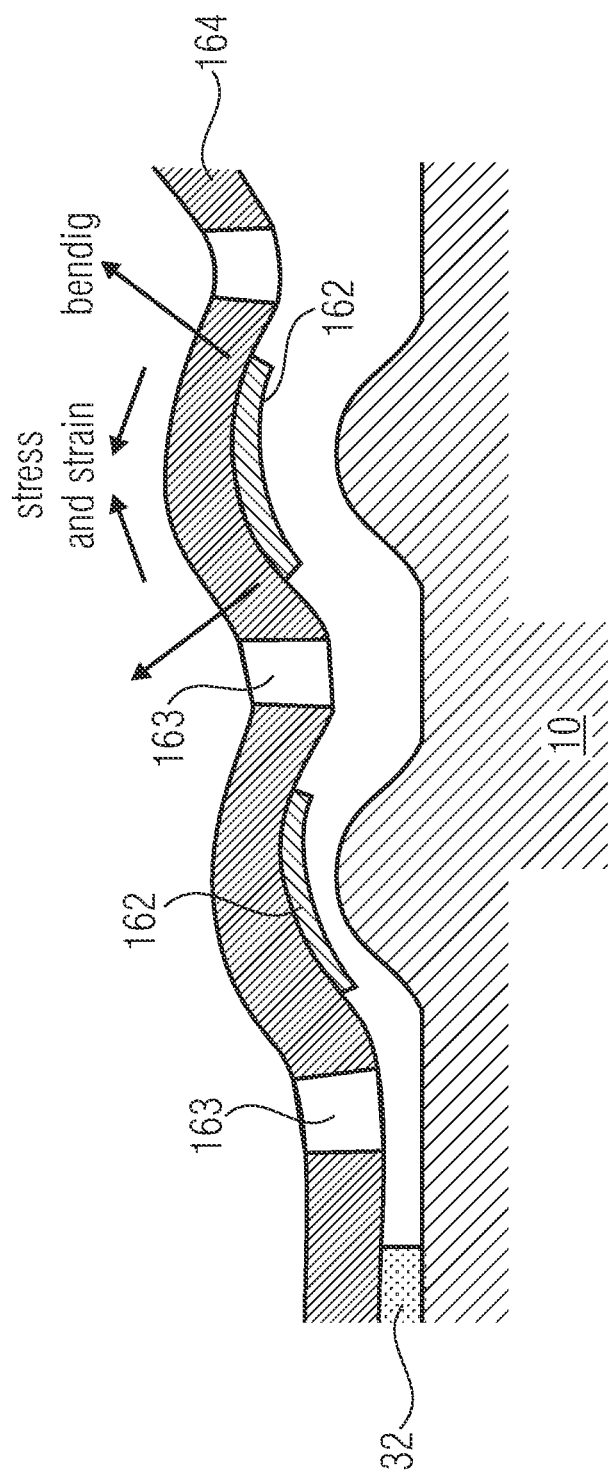
FIG. 9 shows a detail of a cross-section of the micro electrical mechanical system according to an embodiment of the teachings disclosed herein.

FIG. 9 shows a detailed cross-section of the micro electrical mechanical system shown in FIG. 8F. FIG. 9 illustrates the interaction of stress within the pre-tensioning elements 162, strain and bending of the backplate structure 16. The stress is commonly defined as the ratio of applied force F and cross-section A, hence "Force per Area". Strain is defined as "deformation of a solid due to stress." Strain is linked to the stress via the material-specific Young's modulus E.

FIG. 10 shows a perspective, partial cross-section of a backplate structure 16 prior to release etching the backplate structure from the substrate 10. Accordingly, FIG. 10 corresponds approximately to the state that is shown in FIG. 8E. A number of pre-tensioning elements 162 are shown, the two outer ones of which have an annular configuration (when completed in a rotational symmetric manner). The pre-tensioning elements 162 could also be described as patches of a second backplate material. The second backplate material has a different tensile or compressive stress than the (first) backplate material 164. The patches 162 are applied on the surface of the backplate material 164 opposite to a surface thereof which is adjacent to the sacrificial layer 32. As an alternative, the patches 162 could be embedded in the backplate material 164 by means of the two-step deposition process of the backplate material 164 and an intermediate depositing and structuring of the patches 162 described above. The patches 162 are applied at selected locations of the backplate material 164. In particular, in the embodiment shown in FIG. 10, the patches 162 are arranged on locally convex structures of the sacrificial layer 32. The arrangement of the patches 162 on the locally convex structures "amplifies" the deflection of the backplate structure 16. Note that depending on which kind of deflection is desired, the patches 162 could also be arranged in or at locally concave structures of the sacrificial layer 32. Moreover, the relation of the stresses that are present within the backplate material 164 and the patches 162 (tensile stress being higher in the patches 162 than in the backplate material 164, or vice versa; compressive stress being higher in the patches 162 than in the backplate material 164, or vice versa; etc.) also influence the direction and the amount of the deflection of the backplate structure 16.

Figure 11K:
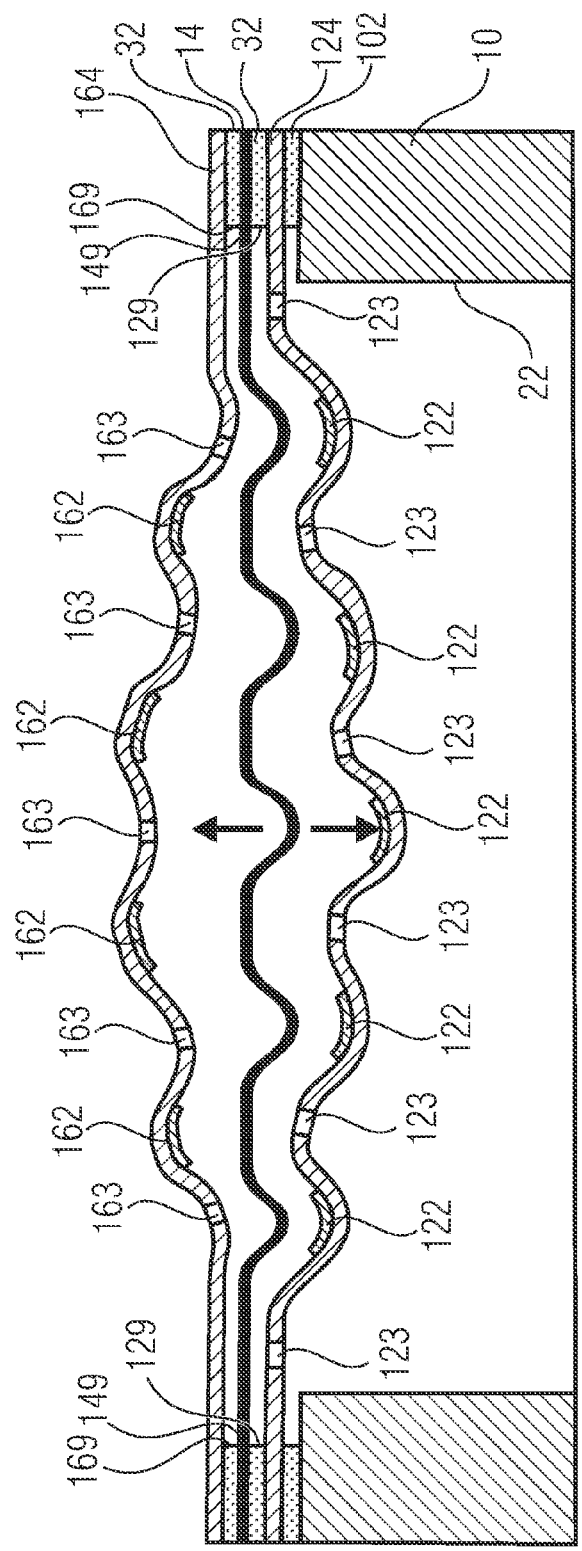

FIGS. 11A to 11K illustrate a method of fabrication of a double backplate system with a corrugated membrane (or membrane structure). FIG. 11A shows a schematic cross-section of a substrate 10 serving as a base layer for subsequent process steps. The substrate 10 is defined with a corrugation preform 61. Several options exist for obtaining the structure shown in FIG. 11A. A first option is to perform a LOCOS (LOCal Oxidation of Silicon) process on the substrate 10, followed by an etching step. A second option would be to mask the substrate 10 at the intended locations of corrugation preforms 61. Then an isotropic substrate etching could be performed, resulting in approximately hemispherical cavities between the corrugation preforms 61. Subsequently, a mask removal is performed. According to a third option one or more oxide rings are formed on the substrate. An oxide deposition is then performed to round the structure. This third option has been used in the past to create corrugations. Besides the three proposed options other options may exist to fabricate the corrugation preform 61.

FIG. 11B shows a schematic cross-section of the substrate 10 after an etch stop layer 102 has been deposited on the corrugated surface of the substrate 10. The etch stop layer may comprise a silicon oxide (SiO).

As illustrated in FIG. 11C a lower backplate material 124 is deposited on the etch stop layer 102. The lower backplate material 124 is also structured in particular to provide etch release holes 123 in the backplate material 124.

FIG. 11D shows a state at which a bending layer has been defined, resulting in the pre-tensioning elements 122. The bending layer may comprise silicon nitride (SiN). The bending layer definition may comprise a deposition and a structuring of the bending layer, the structuring possibly further being sub-divided into masking and etching the bending layer. At the process stage shown in FIG. 11D the pre-tensioning elements 122 are deposited within locally concave structures of the substrate 10, the etch stop layer 102, and the lower backplate material 124.

FIG. 11E illustrates the substrate 10 and the various deposited and/or structured layers in a schematic cross-sectional view after a sacrificial layer 32 has been deposited on a surface of the backplate material 124, the surface facing away from the substrate 10. The sacrificial layer may comprise SiO as a material.

As illustrated in FIG. 11F a membrane or membrane structure 14 is then deposited on a surface of the sacrificial layer 32, the surface again facing away from the substrate 10 as this is the exposed surface of the sacrificial layer 32.

FIG. 11G shows a state of the manufacturing process of a double backplate system with corrugated membrane subsequent to a deposition of a second sacrificial layer 32. As the first sacrificial layer, the second sacrificial layer 32 may comprise or consist of SiO. The second sacrificial layer 32 is deposited on the surface of the membrane or membrane structure 14, the surface facing away from the substrate 10.

FIG. 11H illustrates an upper bending layer definition resulting in the formation of pre-tensioning elements 162. The upper bending layer and the pre-tensioning elements 162 resulting from structuring the upper bending layer may comprise or consist of SiN. The pre-tensioning elements 162 are arranged in or on locally convex structures of the second sacrificial layer 32.

The upper backplate material 164 is then deposited on the second sacrificial layer 32 and the pre-tensioning elements 162. The state subsequent to the upper backplate material deposition can be seen in FIG. 11I. Etch release holes 163 are also structured in the upper backplate material 164.

Subsequent to the definition of the upper backplate material 164 a backside cavity etch is performed, a result of which can be seen in FIG. 11J. The employed etching method may be highly selective with respect to silicon and have only a small etching effect on silicon oxide. Hence, the substrate 10 is etched from the backside until the etching step reaches the etch stop layer 102. The backside cavity 22 may be defined by means of backside masking the substrate 10. Using a second etching process which is selective to silicon oxide the etch stop layer 102 is then removed in order to expose a surface of the lower backplate material 124 that faces away from the membrane structure 14.

FIG. 11K shows the result of the release etch. The release etch introduces an etching agent via the release etch holes 123, 163 into the space occupied by the sacrificial layers 32. Note that according to the embodiment of the method for manufacturing a micro electrical mechanical system illustrated in FIGS. 11A to 11K the material used for the sacrificial layers is silicon oxide, i.e., the same material as has been used for the etch stop layer 102. Therefore, the steps of removing the etch stop layer 102 and performing the release etch to dissolve the sacrificial layers 32 may be performed during a single step. The release etch results in upwards/downwards bending of the upper/lower backplate structures 16, 12 due to the actions of the pre-tensioning elements 122 and 162.

Between the upper and lower backplate structures 16, 12 a relatively large volume is thus created in which the membrane structure 14 may oscillate with a relatively large amplitude. The shape of the upper and lower backplate structures 16, 12 are substantially similar to a shape of the membrane structure 14 when in the upper/lower external position. As a result, at least locally the shapes of the membrane structure 14 and of the upper/lower backplate structures 16, 12 are relatively parallel to each other, thus reducing non-linear effects. A first reason for this local parallelism is that the membrane structure 14 has been manufactured during the same process as the upper/lower backplate structures 16, 12 so that in particular upper/lower corrugations of the membrane structure correspond to the corrugations of the upper/lower backplate structures 16, 12. In other words, the corrugations of the membrane structure 14 are substantially aligned with the corrugations of the upper/lower backplate structures 16, 12. Another reason is that the membrane structure 14 and the upper/lower backplate structures 16, 12 bend in similar manners, because they have approximately the same lateral dimensions and are suspended at approximately the same locations. While the bending deflection of the upper/lower backplate structures 16, 12 is static, the bending deflection of the membrane structure 14 is dynamic, because the membrane structure 14 typically is significantly thinner and/or more flexible than the upper/lower backplate structures 16, 12.

The membrane structure 14 is mechanically connected to a support structure at a membrane structure connection location 149. The support structure comprises, in the configuration shown in FIG. 11K, the substrate 10, a residual portion of the etch stop layer 102, residual portions of the sacrificial layers 32, and circumferential portions of the lower backplate structure 12 and the membrane structure 14.

The lower backplate structure 12 is also mechanically connected to the support structure. In contrast to the membrane structure 14 the lower backplate structure is mechanically connected to the support structure at a backplate structure connection location 129 spaced apart from the membrane structure connection location 149. In a similar manner, the upper backplate structure 16 is mechanically connected to the support structure at an upper backplate structure connection location 169. A distance between the backplate structure 12, 16 and the membrane structure 14 varies over the backplate structure 12, 16, in particular as a function of a lateral extension of the lower backplate structure 12, 16. A minimal distance between the membrane structure 14 and the lower backplate structure 12 is at the backplate structure connection location 129. The distance shall represent the spacing between the membrane structure 14 and the upper/lower backplate structure 16, 12. The distance is, for example, parallel to a main direction of movement of the membrane structure during operation of the micro electrical mechanical system. This means that an air gap between the membrane structure 14 and the upper/lower backplate structure 16, 12 is relatively narrow at the backplate structure connection location 169, 129 and the membrane structure connection location 149. With increasing lateral distance from the support structure the air gap widens up to reach a maximum at (or in the vicinity of) a location that is relatively far away from any backplate structure connection location 129, 169 or membrane structure connection location 149 (e.g., a center of a circular membrane structure 14). Due to manufacturing reasons the width of the air gap at the membrane/backplate structure connection locations 129, 149, 169 is limited to approximately the thickness of the sacrificial layer. Due to the bending deflection of the backplate structures 12, 16 it is possible to obtain larger air gap widths at locations that are farther away from the membrane/backplate structure connection locations 129, 149, 169.

Note that the membrane/backplate structure connection locations 129, 149, 169 may be of various shapes, such as a line, a circle, or a square, depending on the shape of the membrane structure 14 and/or the backplate structure 12, 16. Furthermore, it is possible that the membrane/backplate structure connection locations 129, 149, 169 are spatially distributed, i.e., the membrane structure and/or the backplate structure(s) is/are mechanically connected to the support structure at several individual locations.

Figure 12:
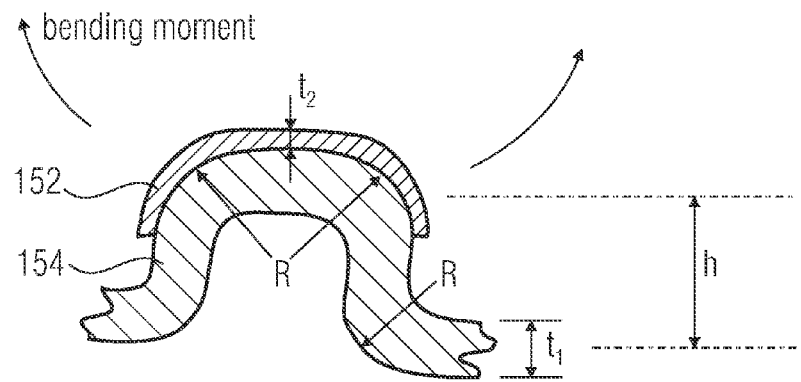
FIG. 12 shows a constructional detail of a backplate structure according to an embodiment of the teachings disclosed herein.

FIG. 12 shows a schematic cross-section through a locally convex structure of the backplate structure. The pre-tensioning element 152 is arranged on a convex surface of the backplate material 154. The backplate material 154 has a thickness t1 and the pre-tensioning element 152 has a thickness t2. The thickness t1 of the backplate material 154 may be between 300 nm to 1 µm, or between 400 nm and 900 nm, or between 500 nm and 800 nm, for example. In the configuration shown in FIG. 12 the backplate material has a thickness t1=660 nm of polysilicon at a tensile stress of 100 MPa. The thickness t2 of the pre-tensioning element 152 may be between 100 nm and 500 nm, or between 200 nm and 400 nm, or between 250 nm and 300 nm. In the configuration shown in FIG. 12 the pre-tensioning element 152 has a thickness of t2=280 nm and the material is mostly SiN with a tensile stress of 1 GPa. The locally convex structure protrudes from a main plane of the backplate material 154 by a height h, which may assume values between 1 µm and 3 µm or 1.5 µm and 2.5 µm, or between 1.6 µm and 2.2 µm. The locally convex structure comprises a number of curved transitions. The outer surfaces of these transitions with respect to the curvature have a radius R which may be between 800 nm and 1200 nm, or between 900 nm and 1100 nm. In the configuration shown in FIG. 12 the radius is R=1 µm.

Figure 13:
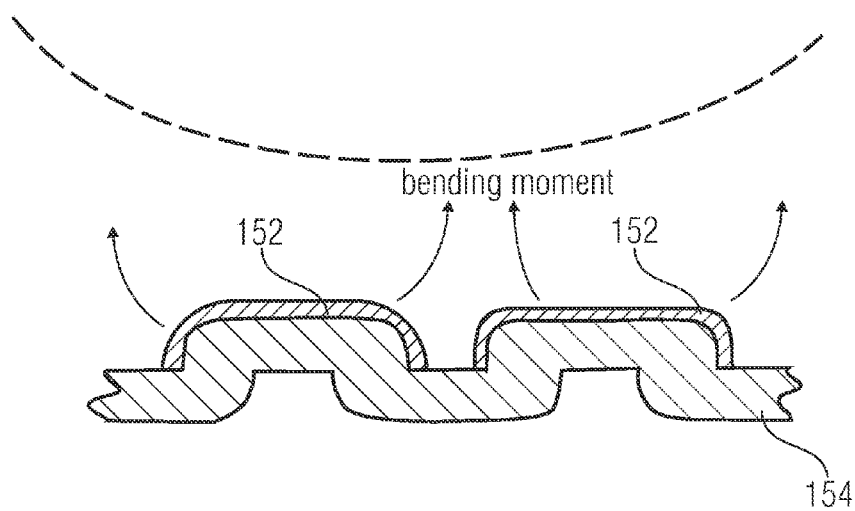
FIG. 13 shows a cross-section of another constructional detail of a backplate structure according to an embodiment of the teachings disclosed herein.

FIG. 13 shows a partial cross-section of a backplate structure comprising the backplate material 154 and two pre-tensioning elements 152, according to at least some possible embodiments. The pre-tensioning elements 152 are arranged on locally convex structures of the backplate material 154. The backplate material 154 actually comprises two structured layers deposited one on top of the other during a manufacturing process. In the cross-sectional view of FIG. 13 it can be seen that the two layers of the backplate material 154 merge at a number of locations so that the resulting backplate material 154 has a meandering shape in cross-section.

Figure 14:
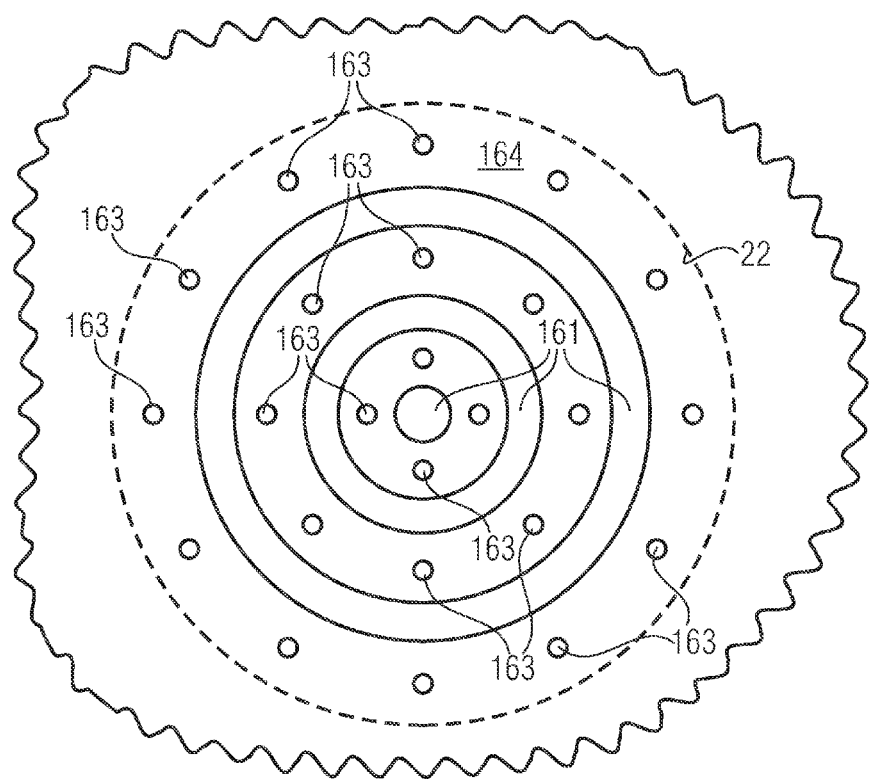
FIG. 14 shows a top-view of the backplate structure according to an embodiment of the teachings disclosed herein.

FIG. 14 shows a top-view of a backplate material 164 at a process step prior to the release etch step (approximately the same state shown in FIG. 11I). The backplate material 164 comprises three concentric corrugations or locally convex structures 161. The center corrugation or locally convex structure 161 has a substantially circular shape, while the two outer corrugations 161 have a substantially annular shape. The location of the cavity 22 is indicated by a dashed line in FIG. 14 in order to provide a spatial reference. A plurality of etch release holes 163 is formed in the backplate material 164. The number of corrugations or locally convex/concave structures 161, 121 is not limited to two or three, but could be higher, for example between three and twenty corrugations, or between five and eighteen corrugations, or between seven and fifteen corrugations.

Figure 15:
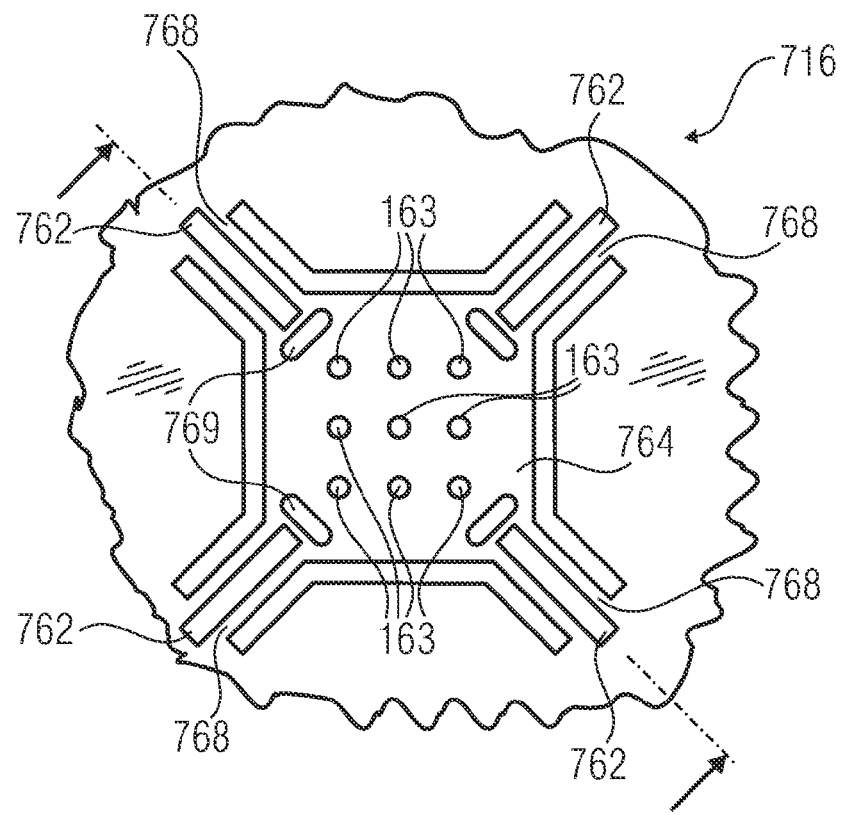
FIG. 15 shows a top-view of a micro electrical mechanical system according to a further embodiment of the teachings disclosed herein.

FIG. 15 shows a schematic top-view of a backplate structure 716 according to a further embodiment of the teachings disclosed herein. The backplate structure 716 comprises the backplate material 764 and four pre-tensioning elements 762. The backplate material 764 comprises a square suspended portion and four support arms 768 arranged to support the suspended portion of the backplate material 764. The support arms 768 comprise an inner end and an outer end. The inner ends of the support arms 768 are mechanically connected to the suspended portion of the backplate material 764. The outer ends of the support arms 768 are mechanically connected to an outer or circumferential portion of the backplate material 764 which, in turn, is mechanically connected to a support structure.

The pre-tensioning elements 762 are arranged on a surface of the support arms 768. Four elongated holes 769 are formed in the suspended portion of the backplate material 764 which may reduce a notch effect caused by the bending deflection of the backplate structure 716 occurring mainly in the region of the support arms 768.

Figure 16:
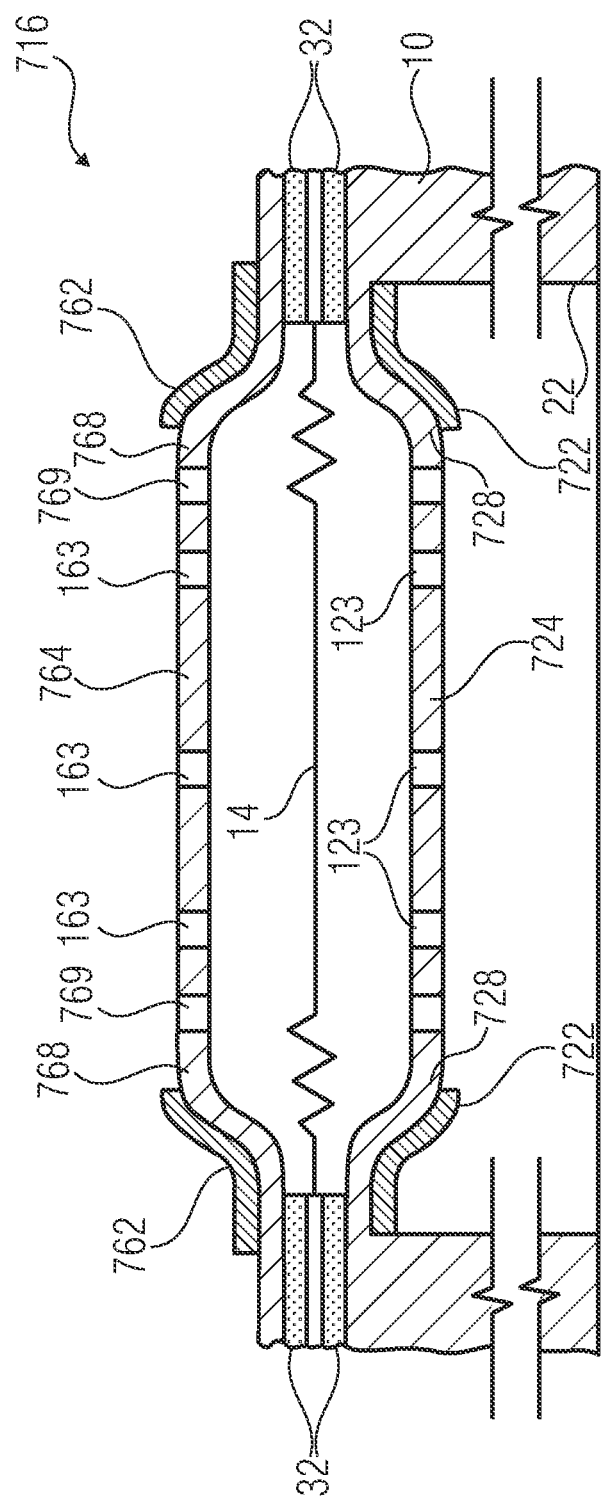
FIG. 16 shows a cross-section through the micro electrical mechanical system shown in FIG. 15.

FIG. 16 shows a schematic cross-section of the backplate structure 716 along the section plane indicated in FIG. 15. In addition, FIG. 16 also shows a lower backplate structure 712, which is substantially symmetrical to the upper backplate structure 716 with respect to a symmetry plane parallel to the planar extension of the suspended portion of the upper and lower backplate structures 716, 712. The upper and lower backplate structures 716, 712 are shown in the released state, i.e., a bending deflection has occurred mainly in the region of the support arms 768, 728, as a result of the pre-tensioning elements 762, 722. The embodiment shown in FIGS. 15 and 16 combine a relatively wide air gap between the membrane structure 14 and the upper/lower backplate structures 716, 712 from a relatively thin sacrificial layer 32 with a substantially plane configuration of the suspended portion of the backplate material 764, 724 acting as counter electrodes for the membrane structure 14. The membrane structure 14 comprises a few corrugations relatively close to a membrane structure connection location (i.e., an edge of the membrane structure 14), thereby leaving a relatively large plane or flat area in the center of the membrane structure 14. The corrugations of the membrane structure 14 facilitate a dynamic bending deflection of the membrane structure 14 during operation of the micro electrical mechanical system as, for example, a microspeaker or a microphone.

Figure 17:
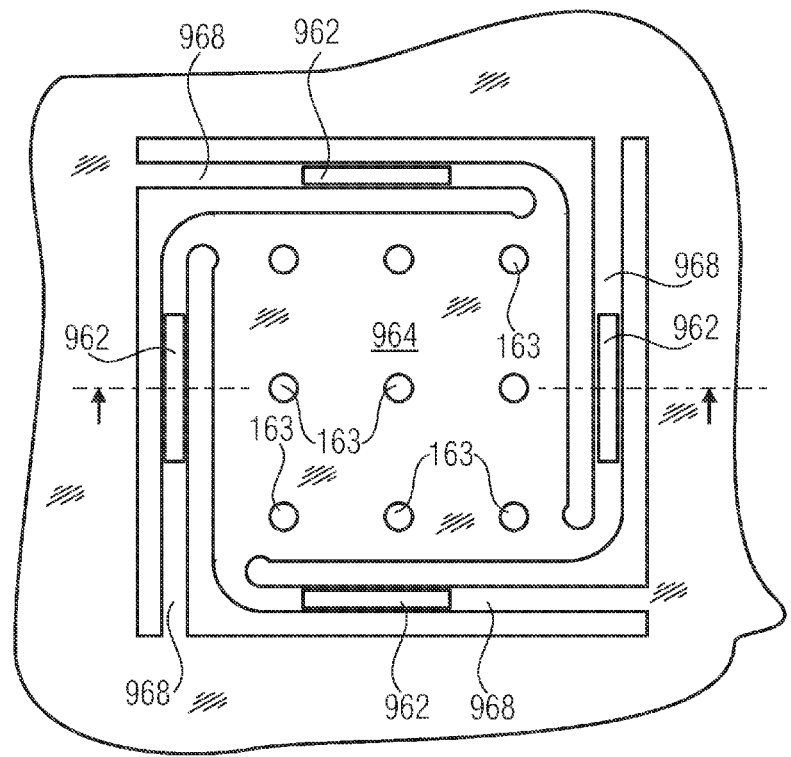
FIG. 17 shows a top-view of a micro electrical mechanical system according to yet another embodiment of the teachings disclosed herein.
Figure 18:
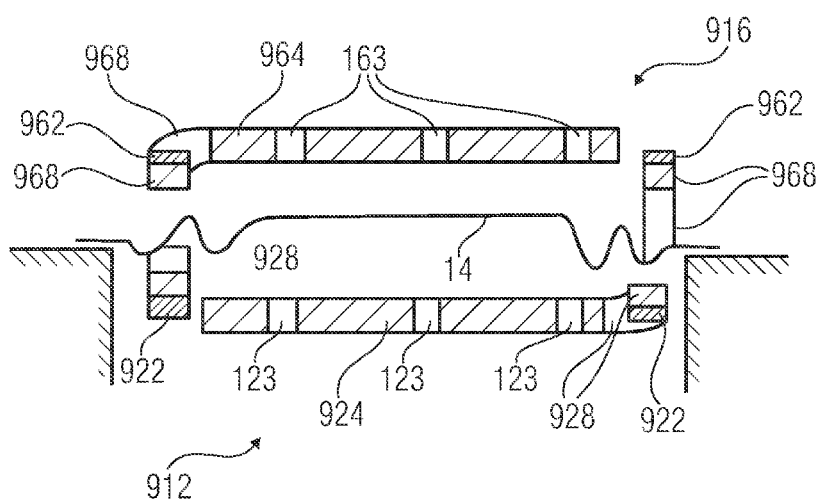
FIG. 18 shows a schematic cross-section through the micro electrical mechanical system shown in FIG. 17.
Figure 19:
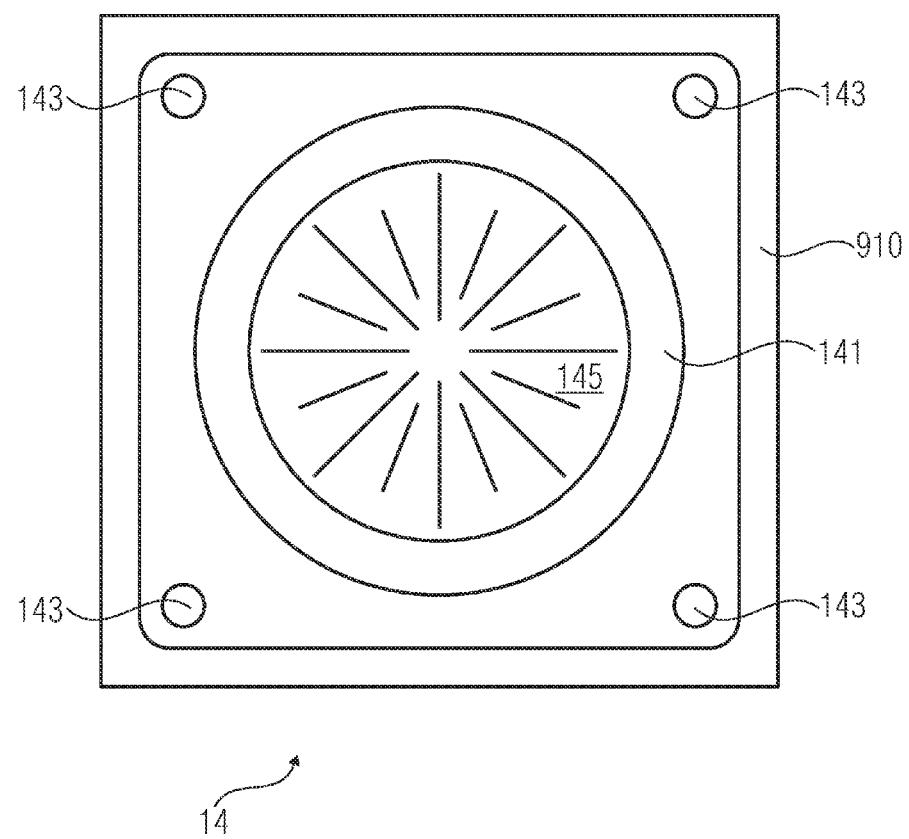
FIG. 19 shows a top-view of a membrane structure of the micro electrical mechanical system shown in FIGS. 17 and 18.

FIGS. 17 to 19 relates to yet a further embodiment of a micro electrical mechanical system according to the teachings disclosed herein which is derived from the embodiment shown in FIGS. 15 and 16.

FIG. 17 shows a top view of a backplate structure 916 comprising the backplate material 964 and the pre-tensioning elements 962. The backplate material 964 comprises four support arms 968. The pre-tensioning elements 962 are arranged on surfaces of the support arms 968. In the alternative, the pre-tensioning elements 962 could be embedded in the support arms 968. A difference to the embodiment shown in FIG. 15 is that the support arms 968 are parallel to an adjacent edge of the suspended portion of the backplate material 964, i.e., the support arms 968 extend along the adjacent edge of the suspended portion. As a consequence, the support arms 968 may be relatively long so that even with a relatively shallow angle of bending a large bending deflection can be obtained at an end of a support arm 968 that is mechanically connected to the suspended portion of the backplate material 964. In order to reduce a notch effect at the mechanical connection between the support arms 968 and the suspended portion of the backplate material 964, a curved transition is provided between the support arms 968 and the suspended portion. The pre-tensioning elements 962 cause the support arms 968 to bend up, i.e., in a direction perpendicular to the drawing plane of the top-view of FIG. 17. This displaces the suspended portion of the backplate material 964 in a direction away from the membrane structure (not shown).

FIG. 18 shows a schematic cross-section of a micro electrical mechanical system to which the backplate structure 916 shown in FIG. 17 belongs. The section plane is indicated in FIG. 17 by a dash-dot-line. The micro electrical mechanical system shown in cross-section in FIG. 18 comprises the upper backplate structure 916 and a lower backplate structure 912. The lower backplate structure 912 is similar to the upper backplate structure 916. In particular, the lower backplate structure 912 comprises a backplate material 924 with a suspended portion and support arms 928. Pre-tensioning elements 922 are arranged on the surfaces of support arms 928, in particular on a surface facing away from the membrane structure 14. The micro electrical mechanical system shown in FIG. 18 comprises or is mechanically connected to a support structure.

FIG. 19 shows a schematic top-view of the membrane structure 14 used within the embodiments shown in FIGS. 17 and 18. The membrane structure 14 comprises a central portion 145 which may be regarded as the active part of the membrane structure 14, i.e., the central portion 145 experiences relatively large amplitudes. The central portion 145 is surrounded by a corrugation 141 which is arranged to enable the relatively large amplitudes of the central portion 145. The membrane structure 14 further comprises four pressure equalization holes 143 which are located close to a circumferential portion of the membrane structure 14. The membrane structure 14 is mechanically connected to the support structure 910 at the circumferential portion which may be regarded as a membrane structure connection location.

Figure 20:
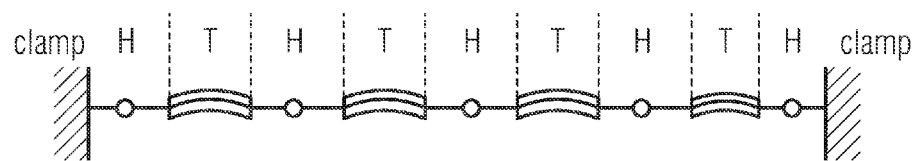
FIG. 20 illustrates a general principle of a structure exhibiting bending deflection using a plurality of pre-tensioning elements and a plurality of hinge elements.

FIG. 20 illustrates a general principle of a structure exhibiting bending deflection using a plurality of pre-tensioning elements and a plurality of hinge elements. The structure comprises a plurality of pre-tensioning elements/composites T and a plurality of hinge elements H. Sections of the structure comprising a pre-tensioning element T alternate with the hinge elements H. The structure is clamped to a support structure at its left end and also at its right end. The hinge elements H are configured to take the strain produced by the pre-tensioning elements T. Due to an interaction between the pretensioning elements T and the hinge elements H the complete structure bends in one direction, for example towards the bottom of FIG. 20.

Figure 21:
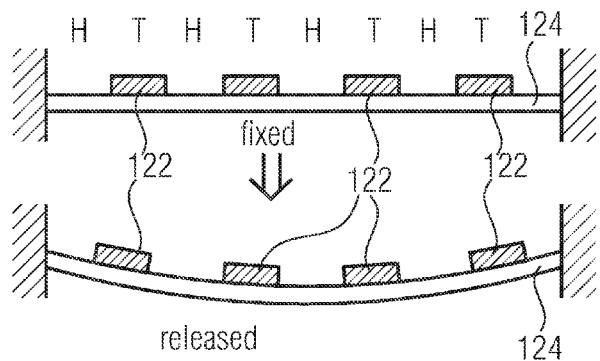
FIG. 21 shows a variation of the structure shown in FIG. 20.

FIG. 21 shows a variation of the structure shown in FIG. 20 which is relatively simple and less effective than other configurations. In an upper picture of FIG. 21 the structure is fixed and in a lower picture of FIG. 21 it is released. The pre-tensioning composites T comprise pre-tensioning elements 122 arranged on a surface of the backplate material 124. The hinge elements H are substantially sections of the backplate material 124 exempt from pre-tensioning elements. In the released state the structure bends in a direction opposite to a facing direction of a surface of the backplate material 124 on which the pre-tensioning elements 122 are arranged.

Figure 22:
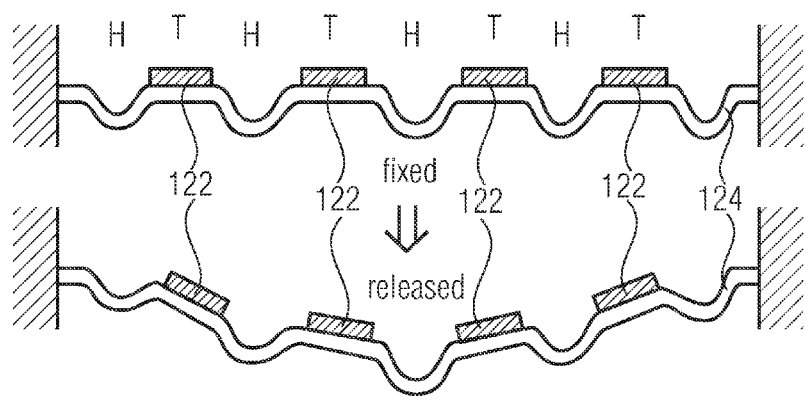
FIG. 22 shows another variation of the structure shown in FIG. 20.

FIG. 22 shows another variation of the structure shown in FIG. 20. The variation shown in FIG. 22 comprises additional corrugations and is more effective than the variation shown in FIG. 21. The corrugations are part of the hinge elements H. An upper picture of FIG. 22 shows a fixed state of the structure and a lower picture of FIG. 22 shows a released state of the structure in which the structure bends down in the center due to the action of the pre-tensioning composites T (which comprise the pre-tensioning elements 122) and the hinge elements H.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

While this invention has been described in terms of several embodiments, there are alterations, permutations, and equivalents which fall within the scope of this invention. It should also be noted that there are many alternative ways of implementing the methods and devices of the present invention.

It is therefore intended that the following appended claims be interpreted as including all such alterations, permutations, and equivalents as fall within the scope of the present invention. The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A micro electrical mechanical system comprising:
a membrane structure; and
a backplate structure comprising a corrugated backplate material and a plurality of structurally separated pre-tensioning elements mechanically connected to the backplate material at different curved sections of the corrugated backplate material, the plurality of pre-tensioning elements configured to cause a mechanical tension on the backplate material for a bending deflection of the backplate structure in a direction away from the membrane structure.

2. The micro electrical mechanical system according to claim 1, wherein at least one pre-tensioning element of the plurality of pre-tensioning elements comprises a patch on a surface of or embedded in the backplate material.

3. The micro electrical mechanical system according to claim 1, wherein the backplate material comprises at least one locally convex structure and wherein at least one pre-tensioning element of the plurality of pre-tensioning elements is arranged on the at least one locally convex structure.

4. The micro electrical mechanical system according to claim 1, wherein the backplate material comprises at least one locally concave structure and wherein at least one pre-tensioning element of the plurality of pre-tensioning elements is arranged on the at least one locally concave structure.

5. The micro electrical mechanical system according to claim 1, wherein each pre-tensioning element of the plurality of pre-tensioning elements comprises a pre-tensioning element material having an intrinsic stress higher than an intrinsic stress of the backplate material.

6. The micro electrical mechanical system according to claim 5, wherein the backplate material has an intrinsic stress in a range from 30 MPa to 200 MPa and wherein the pre-tensioning element material has an intrinsic stress in a range from 500 MPa to 3 GPa.

7. The micro electrical mechanical system according to claim 1, wherein the backplate material comprises a corrugation and wherein at least one pre-tensioning element of the plurality of pre-tensioning elements is arranged at the corrugation.

8. The micro electrical mechanical system according to claim 7, wherein the backplate material comprises at least two concentric corrugations.

9. The micro electrical mechanical system according to claim 7, wherein the membrane structure comprises a corrugation that is aligned with the corrugation of the backplate material in a direction substantially perpendicular to a surface of an electrode material.

10. The micro electrical mechanical system according to claim 1, wherein the backplate material comprises polycrystalline silicon and at least one pre-tensioning element of the plurality of pre-tensioning elements comprises silicon nitride.

11. The micro electrical mechanical system according to claim 1, wherein the backplate structure is fixed to a support at a circumferential portion of the backplate structure.

12. The micro electrical mechanical system according to claim 1, wherein the backplate structure comprises at least one support arm of the backplate material and a suspended portion supported by the at least one support arm, and wherein at least one pre-tensioning element of the plurality of pre-tensioning elements is mechanically connected to the at least one support arm.

13. The micro electrical mechanical system according to claim 1, further comprising a further backplate structure arranged at an opposite side of the membrane structure than the backplate structure, the further backplate structure comprising a layer of the backplate material or a further backplate material and at least one further pre-tensioning element being configured to cause a mechanical tension on the backplate material of the further backplate structure for a bending deflection of the further backplate structure in a direction away from the membrane structure.

14. The micro electrical mechanical system according to claim 1, wherein the backplate structure comprises an electrode configured to electrostatically interact with the membrane structure.

15. The micro electrical mechanical system according to claim 1, wherein the membrane structure and the backplate structure delimit a gap having a vault-like shape.

16. A micro electrical mechanical system comprising:
a support structure;
a membrane structure mechanically connected to the support structure at a membrane structure connection location; and
a backplate structure also mechanically connected to the support structure at a backplate structure connection location spaced apart from the membrane structure connection location, the backplate structure comprising a backplate material and a plurality of pre-tensioning elements mechanically connected to the backplate material and structurally separated by sections of the backplate material exempt from pre-tensioning elements, the plurality of pre-tensioning elements being configured to unfold the backplate structure so that a distance between the backplate structure and the membrane structure varies over the backplate structure and a minimal distance is at the backplate structure connection location.

17. A method for manufacturing a micro electrical mechanical system, the method comprising:
forming a layer for a membrane structure;
forming a sacrificial layer over the layer for the membrane structure;
depositing a layer of a corrugated backplate material over a surface of the sacrificial layer;
forming a plurality of pre-tensioning elements at a surface of or embedded in the backplate material at different curved sections of the corrugated backplate material; and
etching the sacrificial layer, thereby releasing the layer of the backplate material and the plurality of pre-tensioning elements, such that the layer of the backplate material and the plurality of pre-tensioning elements bend in a direction away from the membrane structure.

18. The method according to claim 17, further comprising:
forming at least one locally convex structure or at least one locally concave structure or both on at least one of the layers for the membrane structure and the sacrificial layer;
wherein the at least one pre-tensioning element is deposited on the at least one locally convex structure or the at least one concave structure.

19. The method according to claim 18, wherein forming the at least one locally convex structure or the at least one locally concave structure or both comprises a local oxidation of the membrane structure or of the sacrificial layer.

20. The method according to claim 17, wherein forming the at least one pre-tensioning element embedded in the backplate material comprises:

depositing a layer of a pre-tensioning element material on the surface of the layer of the backplate material;

structuring the deposited pre-tensioning element material to obtain the at least one pre-tensioning element; and depositing a further layer of the backplate material on the structured deposited pre-tensioning element material and exposed parts of the previously deposited layer of the backplate material, to embed the at least one pre-tensioning element in the backplate material.

21. The method according to claim 17, further comprising: forming at least one corrugation in or on the layer of the backplate material, wherein the at least one pre-tensioning element is deposited in or on the at least one corrugation.

22. The method according to claim 17, wherein the backplate material has an intrinsic stress in a range from 30 MPa to 200 MPa and wherein the at least one pre-tensioning element is of a material having an intrinsic stress in a range from 500 MPa to 3 GPa.

23. The method according to claim 17, wherein the backplate material comprises polycrystalline silicon and the at least one pre-tensioning element comprises silicon nitride.

24. The method according to claim 17, wherein forming the layer of the backplate material comprises fixing the backplate material to a support at a circumferential portion of the backplate material; and wherein etching the sacrificial layer creates a suspended portion of the backplate material supported by the circumferential portion and the support.

25. The method according to claim 17, further comprising: structuring the backplate material to form at least one support arm and a suspended portion supported by the at least one support arm;

wherein the at least one pre-tensioning element is deposited at a surface of the at least one support arm so that the at least one support arm bends upon releasing of the backplate material by etching the sacrificial layer.

26. The method according to claim 17, further comprising prior to forming the sacrificial layer:

forming at least one other pre-tensioning element over a surface of a base layer;

depositing another layer of the backplate material over the surface of the base layer and the at least one other pre-tensioning element;

depositing another sacrificial layer over a surface of the other layer of the backplate material; and depositing the layer defining the membrane structure.

27. A method for manufacturing a micro electrical mechanical system, the method comprising:

forming a plurality of structurally separated pre-tensioning elements on a surface of a base layer;

depositing a layer of a corrugated backplate material on the surface of the base layer and the plurality of pre-tensioning elements such that the plurality of pre-tensioning elements are at different curved sections of the corrugated backplate material;

depositing a sacrificial layer on a surface of the layer of the backplate material;

depositing a layer defining a membrane structure on a surface of the sacrificial layer; and etching the sacrificial layer, thereby releasing the layer of the backplate material and the plurality of pre-tensioning elements, which causes the layer of the backplate material and the plurality of pre-tensioning elements to bend in a direction away from the membrane structure as a result of a mechanical tension exerted by the plurality of pre-tensioning elements on the backplate material.

28. A micro electrical mechanical system comprising:

a membrane structure; and a backplate structure comprising a backplate material and at least one pre-tensioning element mechanically connected to the backplate material and selectively formed on the backplate material such that it is formed in a local curved region of the backplate material but is not formed on a local oppositely curved region of the backplate material, the at least one pre-tensioning element being configured to cause a mechanical tension on the backplate material for a bending deflection of the backplate structure in a direction away from the membrane structure.

29. The micro electrical mechanical system according to claim 28, wherein the local curved region is a local concave region of the backplate material and wherein the local oppositely curved region is a local convex region of the backplate material.

30. The micro electrical mechanical system according to claim 29, wherein the backplate material comprises a corrugation and the membrane structure comprises a corrugation that is aligned with the corrugation of the backplate material in a direction substantially perpendicular to a surface of the backplate material.

31. A micro electrical mechanical system comprising:

a membrane structure; and a backplate structure comprising a backplate material, a plurality of structurally separated pre-tensioning elements mechanically connected to the backplate material at different sections of the backplate material, a plurality of support arms of the backplate material and a suspended portion supported by the plurality of support arms, wherein the pre-tensioning elements are selectively formed at different support arms and are configured to cause a mechanical tension on the support arms for a bending deflection of the backplate structure in a direction away from the membrane structure.

32. A microstructural system comprising:

a membrane structure; and a backplate structure spaced apart from the membrane structure and comprising a backplate material and a plurality of structurally separated pre-tensioning elements mechanically connected to the backplate material at different sections of the backplate material, wherein the plurality of pre-tensioning elements exhibit material-related intrinsic stress that is different from material-related intrinsic stress of the backplate material and being configured to cause a mechanical tension on the backplate material for a bending deflection of the backplate structure in a direction away from or towards the membrane structure, so that, during a bending deflection of a bending portion of the backplate structure away from the membrane structure, the bending portion of the backplate structure has an increased distance to the membrane structure, or during a bending deflection of a bending portion of the backplate structure towards the first membrane structure, the bending portion of the backplate structure has a reduced distance to the first membrane structure.

* * * * *

UNITED STATES PATENT AND TRADEMARK OFFICE
CERTIFICATE OF CORRECTION

| | |
|---|---|
| PATENT NO. | : 9,148,726 B2 |
| APPLICATION NO. | : 13/230264 |
| DATED | : September 29, 2015 |
| INVENTOR(S) | : Alfons Dehe |

Page 1 of 1

It is certified that error appears in the above-identified patent and that said Letters Patent is hereby corrected as shown below:

In Col. 20, line 57, claim 32, delete "the first membrane structure," and insert --the membrane structure,--.

In Col. 20, line 58, claim 32, delete "distance to the first" and insert --distance to the--.

Signed and Sealed this
Seventh Day of June, 2016

Michelle K. Lee
*Director of the United States Patent and Trademark Office*